United States Patent [19]
Maegawa

[11] Patent Number: 5,583,362
[45] Date of Patent: Dec. 10, 1996

[54] GATE ALL AROUND THIN FILM TRANSISTOR

[75] Inventor: Shigeto Maegawa, Itami, Japan

[73] Assignee: Mitsubishi Denki Kabushiki Kaisha, Tokyo, Japan

[21] Appl. No.: 305,826

[22] Filed: Sep. 14, 1994

[30] Foreign Application Priority Data

Sep. 17, 1993 [JP] Japan .................................. 5-231849
Aug. 19, 1994 [JP] Japan .................................. 6-195669

[51] Int. Cl.⁶ .................................................. H01L 27/01
[52] U.S. Cl. .......................... 257/347; 257/351; 257/352; 257/365; 257/401
[58] Field of Search .................................. 257/347, 348, 257/349, 350, 351, 331, 352, 365, 401; 359/59

[56] References Cited

U.S. PATENT DOCUMENTS 5,308,999  5/1994  Gotou ........................ 257/66
5,338,959  8/1994  Kim et al. .................. 257/66
5,396,099  3/1995  Kitajima ..................... 257/347

OTHER PUBLICATIONS

Colinge et al, "Silicon–On–Insulator 'Gate–All–Around Device'", Electron Devices Society of IEEE, Dec. 1990, pp. 25.4.1–25–.4.4.

Primary Examiner—Minh Loan Tran
Attorney, Agent, or Firm—Leydig, Voit & Mayer

[57] ABSTRACT

A semiconductor device having at least one transistor having a channel member spaced from a semiconductor substrate, an insulating film on the substrate, and a control electrode on the channel member covering the channel member. The control electrode forms a channel in each of two opposed surfaces of the channel member. The channel member is a polycrystalline semiconductor.

12 Claims, 31 Drawing Sheets

FIG. IA
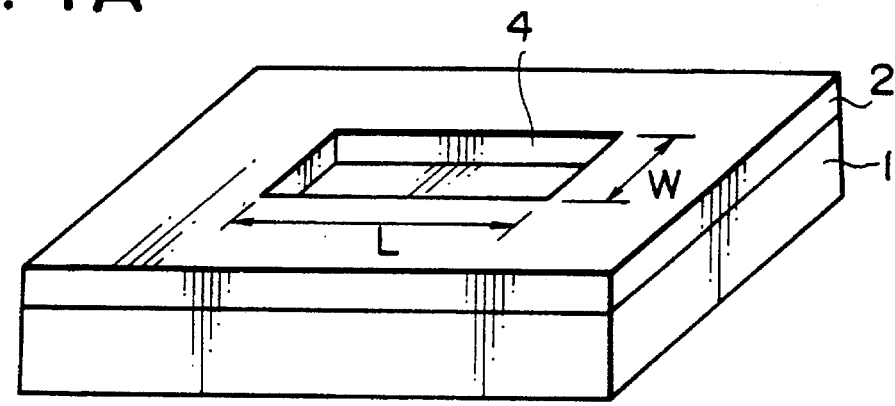
FIG. IB
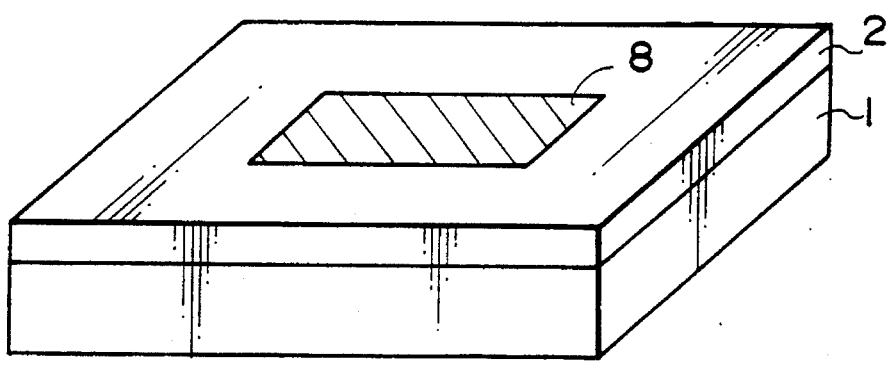
FIG. IC
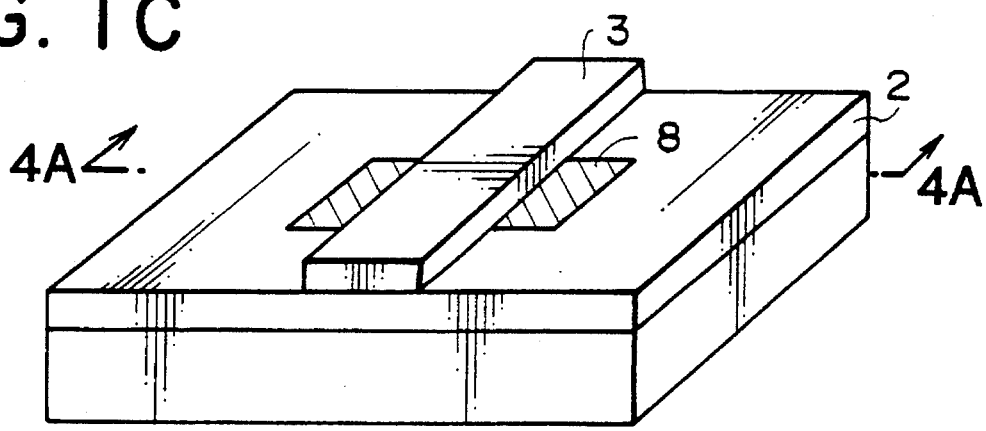

GATE ALL AROUND THIN FILM TRANSISTOR

BACKGROUND OF THE INVENTION

1. Field of the Invention

This invention relates to a semiconductor device including a semiconductor thin film and a method of manufacturing the semiconductor device.

2. Description of the Related Art

FIGS. 31A, 31B and 31C illustrate the structure of a semiconductor device having a gate all around (GAA) type of thin film transistor, such as described on page 595 of IEDM'90 (International Electron Devices Meeting) Technical Digest, and showing a method of manufacturing this transistor. On a silicon substrate 1 shown in FIGS. 31A to 31C are formed a first silicon oxide film 2, which is an insulating film provided as a base for formation of electrodes of the transistor, and a channel silicon film 3 formed of a silicon monocrystal for forming output electrodes of the transistor. The silicon substrate 1, the first silicon oxide film 2 and the channel silicon film 3 are formed by a manufacturing method called SIMOX (Separation by IMplanted OXygen). In a SIMOX process, oxygen is introduced into the silicon substrate 1 by high-concentration ion implantation to form an oxide film, thereby separating the silicon substrate 1 and the channel silicon film 3.

An opening (hole) 4 is formed in the first silicon oxide film 2 to enable the gate electrode 6 to cover a portion of the channel silicon film 3 from above and below as viewed in the illustration (in the direction of arrows q and q' shown in FIG. 31B) in a sandwiching manner. Such formation of the gate electrode 6 characterizes this GAA transistor. A second silicon oxide film 5 is formed as a gate insulation film for insulation between the channel silicon film 3 and the gate electrode 6. The gate electrode 6 is a polysilicon film.

FIGS. 32A through 32E are diagrams of a process of manufacturing this semiconductor device. Each of these figures is a cross-sectional view taken along a line corresponding to the line 32—32 of FIG. 31C; FIGS. 32B, 32C, and 32E are cross-sectional views of FIGS. 31A, 31B, and 31C, respectively.

FIG. 33 is a cross-sectional view taken along the line 33—33 of FIG. 31C.

The GAA transistor, having such a structure, is characterized in that a large current flows through it when it is on. In the GAA transistor, as shown in FIGS. 31C, 32E and 33, the gate electrode 6 is formed in such a manner that the channel silicon film 3 is sandwiched between portions of the gate electrodes 6 facing the two surfaces of the channel silicon film 3 from above and below (in the directions q and q' indicated in FIGS. 31B and 32E). A channel is formed in the channel silicon film 3 in response to a bias voltage applied to the gate electrode 6 to affect a current flow. In the structure shown in FIGS. 31C, 32E and 33, therefore, the channel is formed both at the upper and lower interfaces on the channel silicon film 3 opposite to the directions q and q'. Accordingly, the current flowing through the transistor when the transistor is on is at least twice that in the conventional transistor having a gate electrode only formed on one side. Moreover, if the channel silicon film 3 is thin, the channel is formed throughout the channel silicon film so that a larger current can flow therethrough.

The method of manufacturing the GAA transistor will next be described. First, a surface silicon film 21 of a SIMOX wafer is selectively etched to form a desired pattern (FIG. 32A), and channel silicon film 3 is formed in accordance with the desired pattern by photolithography (FIGS. 31A, 32B). Next, a portion of first silicon oxide film 2 located below a portion of the channel silicon film 3 of the GAA transistor in which a channel is to be formed is removed by wet etching to form opening 4. As a result, the portion of the channel silicon film 3 in which a channel will be formed extends like a bridge over the opening 4, as viewed in the cross-sectional views of FIGS. 31B and 32C.

Next, second silicon oxide film 5 to be used as a gate insulation film of the transistor is formed (FIG. 32D). Second silicon oxide film 5 covers all surfaces of the channel silicon film 3, because it is formed by chemical vapor deposition (CVD). Thereafter, a polysilicon film for forming gate electrode 6 is formed by deposition on the second silicon oxide film 5 and is patterned in accordance with a predetermined pattern by photolithography. In this manner, the GAA transistor is completed with the gate electrode 6 formed on both the upper and lower sides of channel silicon film 3 in which a channel is formed (FIGS. 31C, 32E). A channel is formed on each of the upper and lower sides of the channel silicon film 3.

As seen in FIG. 33, a cross-sectional view of the thus-formed GAA transistor, a gate electrode portion 6b formed below the channel silicon film 3 remains without being etched at the time of patterning, since the gate electrode 6 is etched from above. The gate electrode 6b is therefore longer than a gate electrode portion 6a formed above the channel silicon film 3.

These conventional semiconductor devices have been constructed and manufactured by a SIMOX process. This is because channel silicon film 3 is formed as monocrystal in order that a larger current can flow through the channel. However, it is not possible to form a silicon monocrystal by superposing it on the GAA transistor formed in this manner. The GAA transistor can be formed in a structure of at most one layer, and not in a multilayer structure. It is therefore difficult to increase the integration density of the conventional GAA transistors.

In the conventional semiconductor device manufacturing process, channel silicon film 3 is first formed from monocrystal silicon film 21, and opening 4 for forming a thin film transistor is thereafter formed. Therefore, dry etching cannot be performed for forming opening 4 (because it is difficult to remove the portion of the first silicon oxide film 2 hidden by the channel silicon film 3), and wet etching using a liquid such as hydrofluoric acid. Wet etching, however, is isotropic etching, whereby a material is etched equally in all directions. Accordingly, the first silicon oxide film 2 is etched not only in the direction of the silicon substrate 1 (in the direction q in FIG. 32C) but also in a direction parallel to the silicon substrate, e.g., a direction p perpendicular to the direction q, as shown in FIG. 32C, so that the resulting opening 4 is slightly larger than the resist film pattern provided in the lithography step in the direction p. It is therefore difficult to form opening 4 in accordance with a very fine pattern for an increase in the integration density of GAA transistors.

SUMMARY OF THE INVENTION

In view of the above-described problems, an object of the present invention is to provide a thin film transistor in which a portion where a channel is formed can be precisely constructed to improve the integration density, and a method of manufacturing the thin film transistor.

To achieve this object, according to the present invention, there is provided a semiconductor device comprising a transistor having a channel member formed by providing a space between the channel member and a semiconductor substrate on which an insulating film is formed, and a control electrode formed so as to cover the channel member, the control electrode being capable of forming a channel in each of two surfaces of the channel member, wherein the channel member is formed of a polycrystal semiconductor.

BRIEF DESCRIPTION OF THE DRAWINGS

FIGS. 1A through 1C, and 2A through 2D are diagrams showing a semiconductor device and a method of manufacturing the semiconductor device in accordance with a first embodiment of the present invention;

Figure 2A:
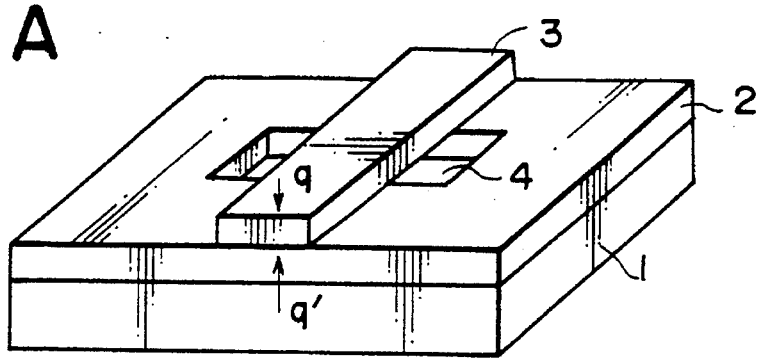

DESCRIPTION OF THE PREFERRED EMBODIMENTS (Embodiment 1)

The first embodiment of the present invention will be described with reference to the drawings.

FIGS. 1A through 1C and FIGS. 2A through 2D are diagrams showing the structure of a semiconductor device in accordance with this embodiment and a method of manufacturing the semiconductor device. The process step shown in FIG. 2A follows the process step shown in FIG. 1C.

In FIGS. 1A through 1C and FIGS. 2A through 2D are illustrated a silicon substrate 1 and a first silicon oxide film 2 which is formed on the silicon substrate 1, and which is an insulating film provided as a base for formation of electrodes of a transistor. A channel silicon film 3 is formed of polycrystal silicon (polysilicon) by a thin film forming method, and is provided to form a channel of the transistor. An opening (hole) 4 is formed in the first silicon oxide film 2 to enable the gate electrode 6 to cover a portion of the channel silicon film 3 from above and below in a sandwiching manner. A second silicon oxide film 5 is formed as a gate insulation film for insulation between the channel silicon film 3 and the gate electrode 6. The gate electrode 6 is formed of a polysilicon film. A silicon nitride film 8 is formed as a dummy film for temporarily closing the opening 4 to prevent the material of the channel silicon film 3 from entering the opening 4.

Figure 2B:
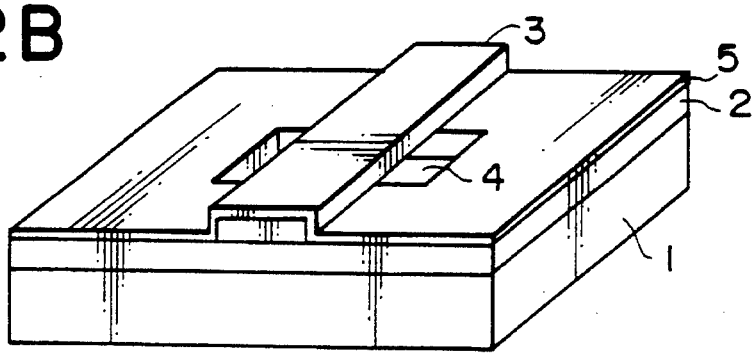
Figure 2C:
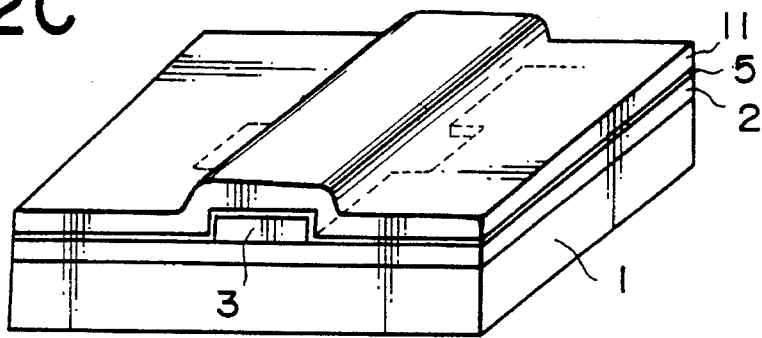
Figure 2D:
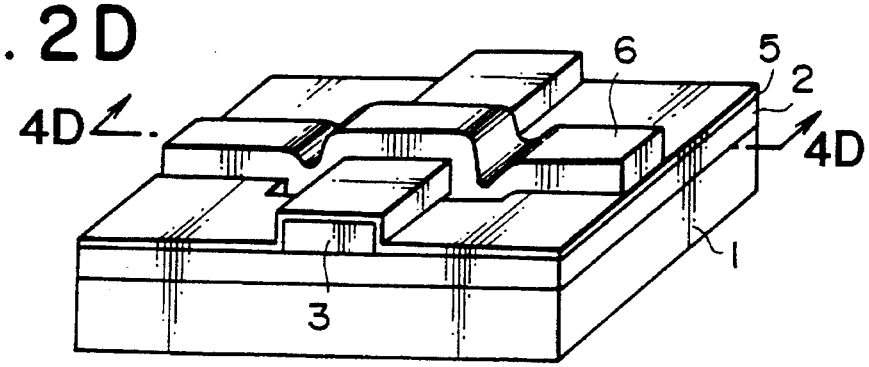
Figure 3A:
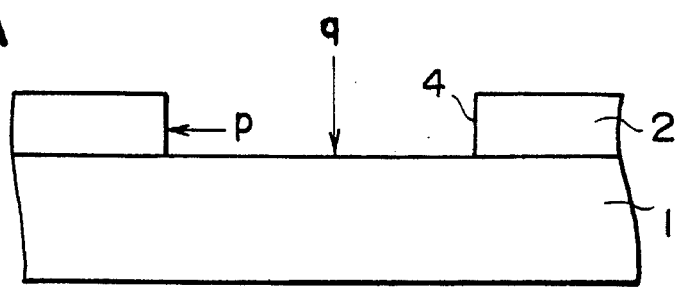
FIGS. 3A through 3D, and 4A through 4D are cross-sectional views of the semiconductor device and the manufacturing method of the first embodiment of the invention.
Figure 3B:
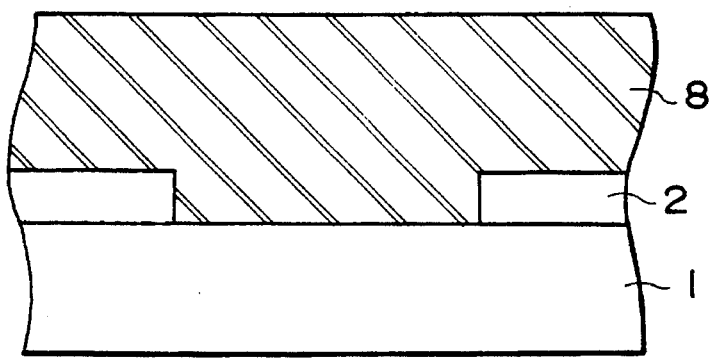
Figure 3C:
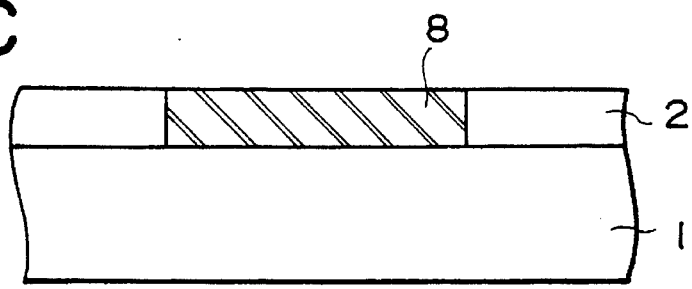
Figure 3D:
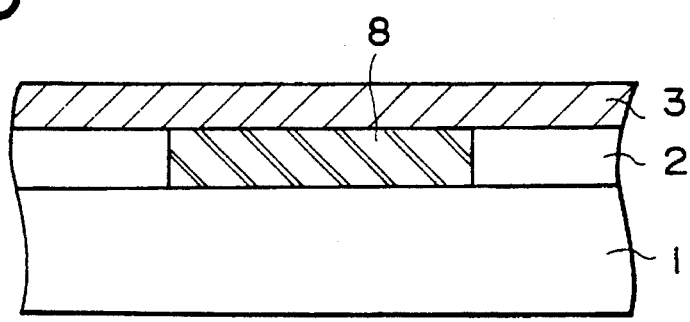
Figure 4A:
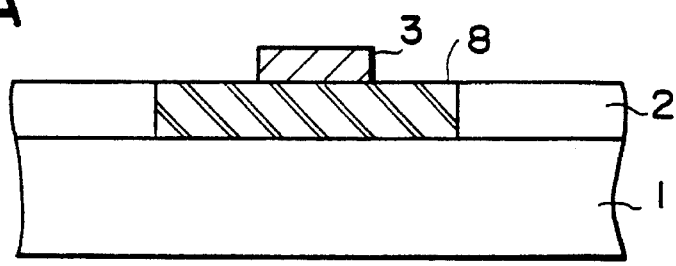
Figure 4B:
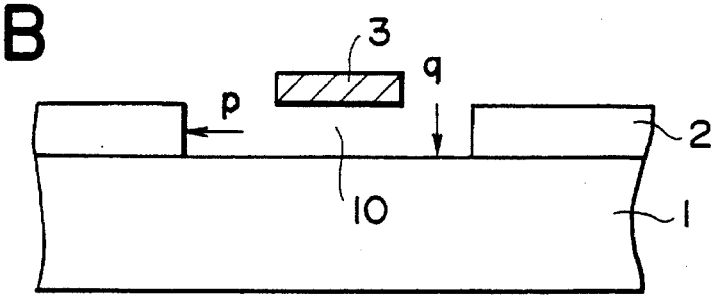
Figure 4C:
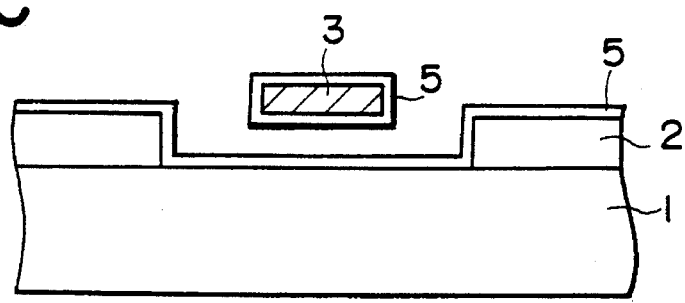
Figure 4D:
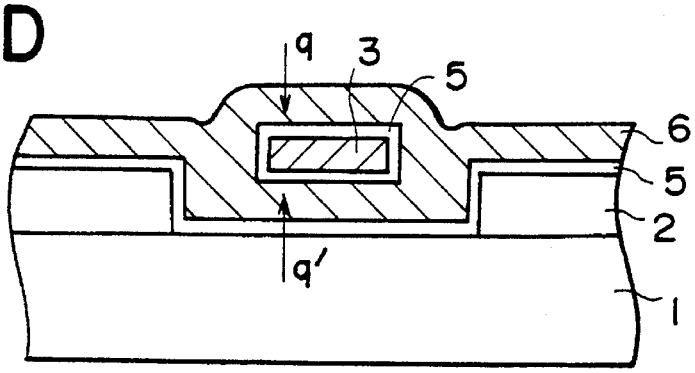

FIGS. 3A through 3D, and 4A through 4D are each a cross-sectional view taken along a line corresponding to the line 3—3 of FIG. 1C or 2D. FIGS. 3A and 3C are cross-sectional views of FIGS. 1A and 1B, respectively. FIGS. 4A, 4B and 4C are cross-sectional views of FIGS. 1C, 2A and 2B, respectively, and FIG. 4D is a cross-sectional view of FIGS. 2C and 2D.

The GAA transistor of this embodiment using polysilicon as channel silicon film 3 is also characterized in that a large current flows through it when it is on, as in the case of the conventional GAA transistor. That is, a channel is formed at each of the upper and lower interfaces of the channel silicon film 3 (perpendicular to the directions of arrows q and q' indicated in FIG. 4D), so that the current through the transistor when the transistor is on is substantially twice that of the conventional transistor in which the channel is only formed on one side.

On the other hand, the transistor of this embodiment, in which the channel silicon film 3 is formed of polysilicon, can be constructed with a higher degree of freedom, in comparison with the conventional art in which the channel silicon film 3 is formed of a silicon monocrystal. That is, while the conventional GAA transistor can be formed only in a one-layer structure, multiple layers of channel silicon film 3 can be formed by using polysilicon in place of silicon monocrystal and there is no need for epitaxial layer formation in the method of manufacturing the transistor in accordance with this embodiment. Thus, the present invention makes it possible to form desired transistors in a multilayer structure of any number of layers according to one's need.

This effect is a necessary condition for applications of the GAA transistor to static random access memories (SRAM) having a multilayer structure.

Moreover, since there is no need to grow a silicon monocrystal, it is not always necessary to use a silicon substrate as the substrate of the present invention. Therefore, the degree of freedom in selecting the substrate is increased. For example, the transistor can be formed on a glass substrate and it is therefore possible to apply the GAA transistor to a thin film transistor (TFT) type liquid crystal panel.

The method of manufacturing the semiconductor device of this embodiment will now be described.

[Step A]

A silicon oxide film having a predetermined thickness (e.g., about 1,000 Å) is formed on silicon substrate 1 by thermal oxidation. A predetermined resist pattern is formed on the silicon oxide film by photolithography, and the silicon oxide film is removed by using an anisotropic dry etching technique (e.g., reactive ion etching) to form opening 4 having a predetermined size (FIGS. 1A, 3A). The etched silicon oxide film having the desired pattern remains a first silicon oxide film 2. Since an anisotropic dry etching technique is used, the silicon oxide film is etched in the direction of silicon substrate 1 (a direction q in FIG. 3A) and is not etched in a direction parallel to silicon substrate 1 (a direction p in FIG. 3A). Accordingly, opening 4 does not become larger than the resist pattern. It is therefore possible to form opening 4 precisely.

When opening 4 is formed by dry etching, the corresponding portion of first silicon oxide film 2 may be completely removed so that silicon substrate 1 is exposed, or a layer of first silicon oxide film 2 covering silicon substrate 1 may be left. That is, an amount of etching sufficient to reach a predetermined depth of opening 4 (e.g., about 1,000 Å) may suffice. Also, the size (area) of opening 4 may be selected so as to be slightly larger than the size (L and W) of the thin film transistor to be formed.

[Step B]

The thus-formed opening 4 is filled with silicon nitride film 8 by low-pressure chemical vapor deposition (LP-CVD) (at a reaction temperature of 700° to 800° C., for example) (FIG. 3B) for the purpose of preventing channel silicon film 3 from entering and filling opening 4 when channel silicon film 3 is formed. It is necessary to remove silicon nitride film 8 in opening 4 subsequently in a step described later without affecting first silicon oxide film 2, channel silicon film 3 and other portions or members. Therefore, the material for filling opening 4 must be a material selectively removable by wet etching (for example, a material etched more easily than the silicon oxide film and polysilicon). As a material satisfying this condition, silicon nitride film is used. Also, hot phosphoric acid or the like is used as an etchant for removing the silicon nitride film.

To fill opening 4, silicon nitride film 8 is deposited by LP-CVD to have a thickness of, for example, equal to or larger than ½ of the width of opening 4 (0.25 μm) or more, if the width of the opening is 0.5 μm, as shown in FIG. 3B.

Next, anisotropic etching (reactive ion etching or the like) is performed for etching back of the entire surface. That is, etching is performed to remove the silicon nitride film 8 and is stopped when first silicon oxide film 2 is exposed, as shown in FIG. 3C. Silicon nitride film 8 is thereby left only in opening 4 which is thereby filled with silicon nitride film so that the surfaces of films 2 and 8 are flush with each other (FIG. 1B).

[Step C]

Channel silicon film 3 of polysilicon is formed on the filling silicon nitride film 8 by depositing polysilicon to a predetermined thickness (e.g., 400 Å) by LP-CVD (at a reaction temperature of 400° to 700° C., for example) without adding impurities (FIG. 3D), and by photolithography and etching (FIGS. 1C, 4A). A main section of the thin film transistor is thereby formed.

[Step D]

Silicon nitride film 8 formed as a filling in Step B is removed. For example, silicon nitride film 8 is removed by being immersed in hot phosphoric acid at 150° to 200° C. A space 10 is thereby formed under first polysilicon 3 (FIGS. 2A, 4B). The height of the space is equal to the thickness of first silicon oxide film 2 if silicon substrate 1 is exposed through opening 4.

[Step E]

Second silicon oxide film 5 is deposited by LP-CVD (at a reaction temperature of 600° to 900° C., for example) to a predetermined thickness (e.g., 200 Å). Second silicon oxide film 5 is thereby formed on the surface of first silicon oxide film 2, around the channel silicon film 3 portion and in opening 4 (FIGS. 2B, 4C). Silicon oxide film 5 may be formed by thermal oxidation (at a reaction temperature of 800° to 1,000° C.).

[Step F]

To form gate electrode 6, polysilicon film 11 to which phosphorus is added is deposited by LP-CVD (at a reaction temperature of 500° to 700° C., for example) on silicon oxide film 5 formed in Step E to a predetermined thickness (e.g., about 1,500 Å) (FIG. 2C). The coverage of LP-CVD is so broad that space 10 is completely filled with polysilicon film 11.

[Step G]

Polysilicon film 11 is formed in accordance with a predetermined pattern by photolithography and etching (FIGS. 2D, 4D), thereby forming gate electrode 6 of the GAA transistor.

[Step H]

Arsenic is introduced by ion implantation into a portion of channel silicon film 3 not covered with polysilicon film (gate electrode) 6 to form N-type regions, i.e., source and drain regions of the thin-film transistor.

As described above, in the semiconductor device manufacturing method of this embodiment, opening 4 provided under channel silicon film 3 of the GAA transistor is formed before channel silicon film 3 is formed. Therefore, it can be formed by anisotropic dry etching instead of wet etching, and can therefore be formed with a precise pattern (of about 1.0 μm, for example).

If opening 4 is formed by wet etching, it is impossible to form such a fine pattern for the reason described below with reference to FIG. 5.

Figure 5:
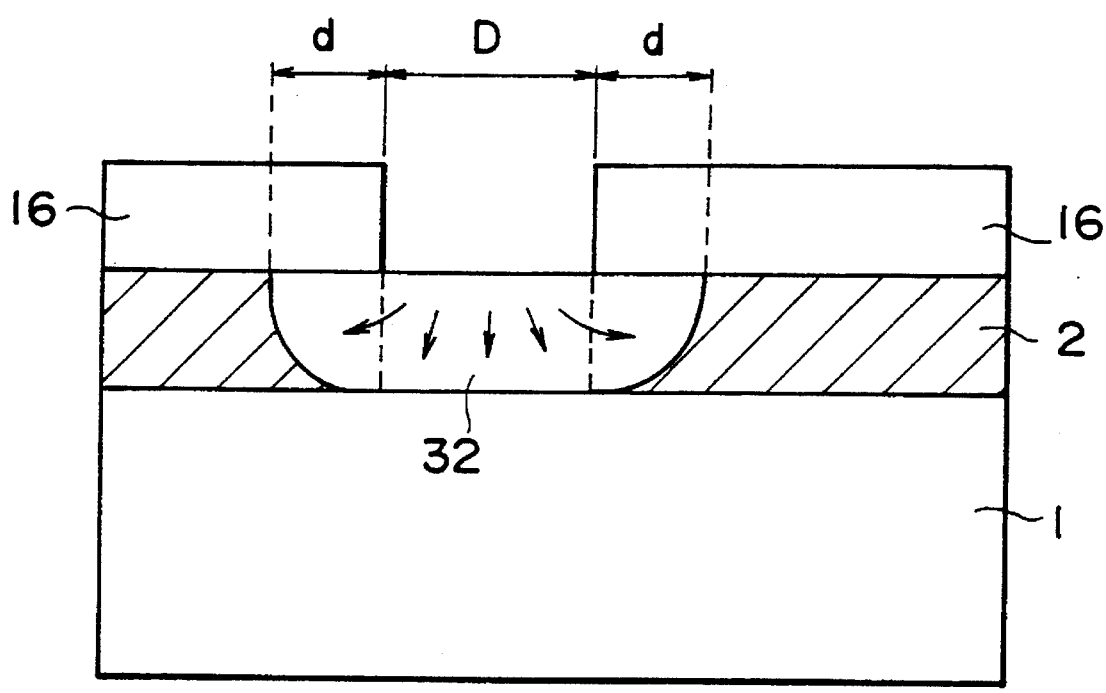
FIG. 5 is a diagram of an opening width of the first embodiment of the invention.

FIG. 5 is a cross-sectional view of the formation of opening 4 in the case where first silicon oxide film 2 is etched using a resist 31 having an opening width D to form opening 4. When first silicon oxide film 2 is removed using a hydrofluoric acid solution, it is etched through a distance d both in vertical and lateral directions as viewed in FIG. 5. Such etching in lateral directions is called side etching. Because of side etching, an etched opening 32 having a width larger than the aperture width D of resist 31 by 2d is formed when silicon substrate 1 is exposed and etching is completed. Side etching is caused in this manner in the case of wet etching, and the size of the etched opening is therefore larger than the desired size corresponding to the aperture width D of resist 31.

To obtain an etched opening 32 having the desired width D, the size of the aperture in resist 31 may be reduced by a value (2d) corresponding to the increase in size caused by side etching (D'=D−2d). However, there is a certain limit to the resist aperture width (aperture limit), and the resist aperture width cannot be smaller than a minimum etching width of lithography. That is, the minimum width of the opening in first silicon oxide film 2 cannot be smaller than the sum of the minimum aperture width determined by lithography and the side etching distance.

In contrast, in the case of using dry etching, etched opening 32 can be formed so as to have a width substantially equal to the minimum aperture width, since there is substantially no side etching effect.

Thus, it is possible to form an opening having a size within a resist aperture limit of about 1 μm by performing dry etching in accordance with this Embodiment 1.

(Embodiment 2)

The second embodiment of the present invention, i.e., Embodiment 2, will be described. In this embodiment, a GAA transistor is formed without using opening 4 of the first embodiment.

FIGS. 6A through 6C and FIGS. 7A through 7C are diagrams showing the structure of a semiconductor device in accordance with this embodiment and a method of manufacturing the semiconductor device. The process step shown in FIG. 7A follows the process step shown in FIG. 6C.

In this embodiment, a silicon nitride film 9 is formed on first silicon oxide film 2 to provide a space 10 between first silicon oxide film 2 and channel silicon film 3. Silicon substrate 1, first silicon oxide film 2, channel silicon film 3, second silicon oxide film 5 and gate electrode 6 are the same as those of the first embodiment and will not be specifically described.

Figure 6A:
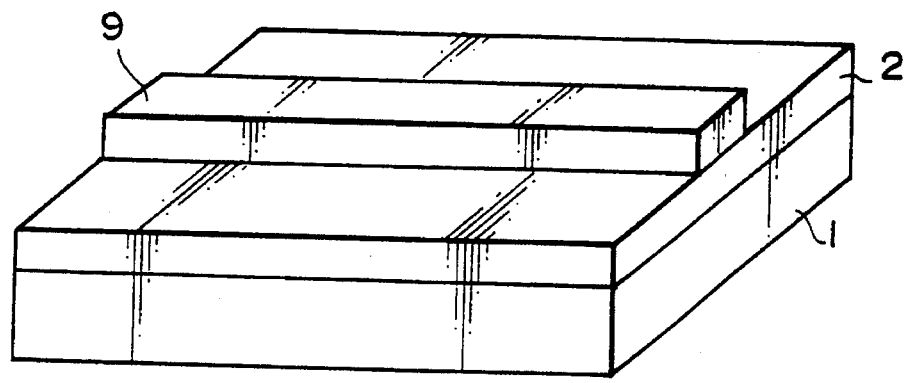
FIGS. 6A through 6C and 7A through 7C are diagrams showing a semiconductor device and a method of manufacturing the semiconductor device in accordance with a second embodiment of the present invention.
Figure 6B:
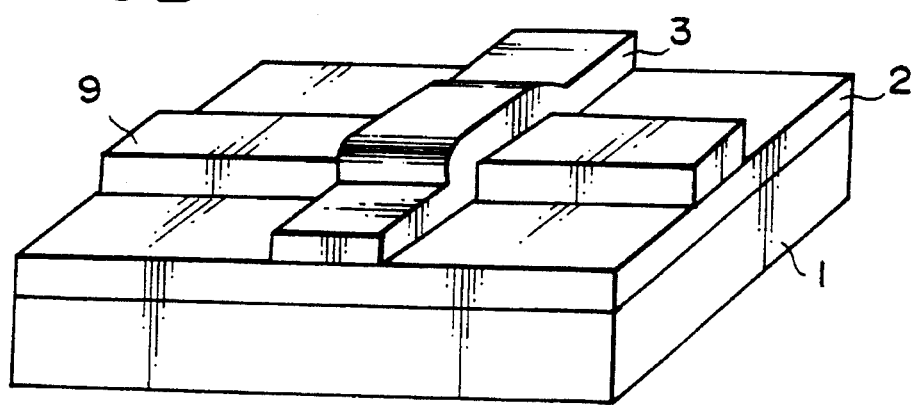
Figure 6C:
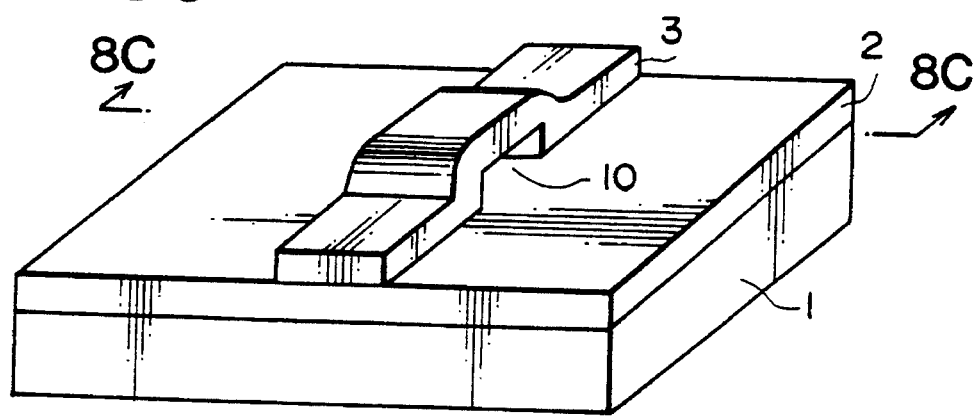
Figure 7A:
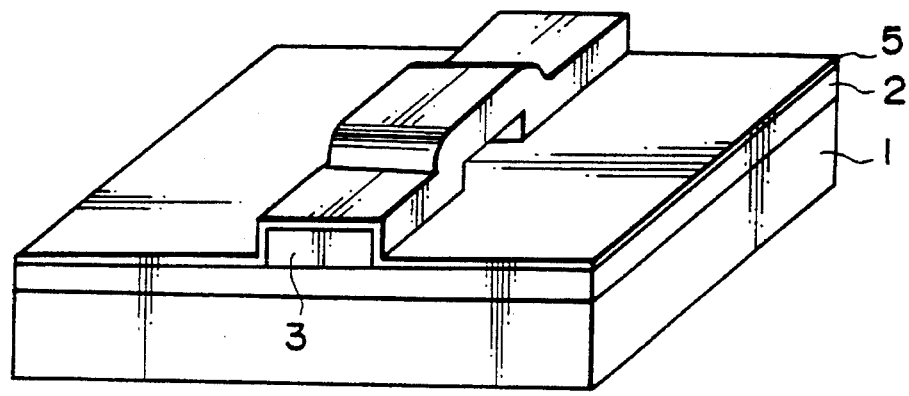
Figure 7B:
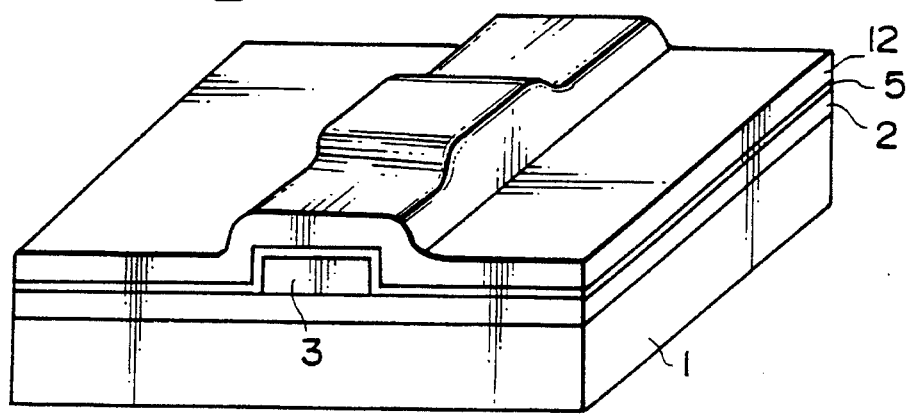
Figure 7C:
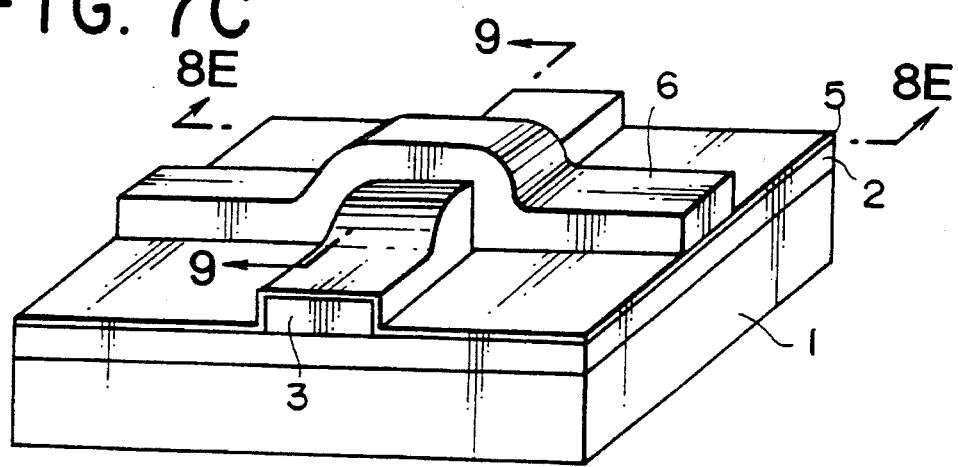
Figure 8A:
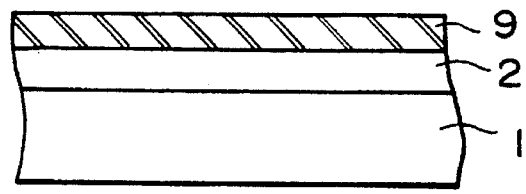
FIGS. 8A through 8E, and 9 are cross-sectional views of the semiconductor device and the manufacturing method of the second embodiment of the invention.
Figure 8B:
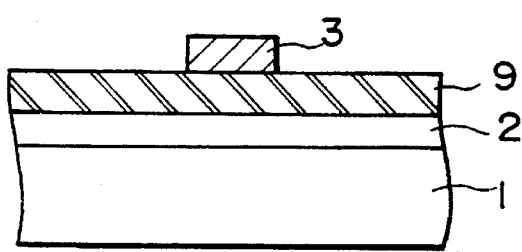
Figure 8C:
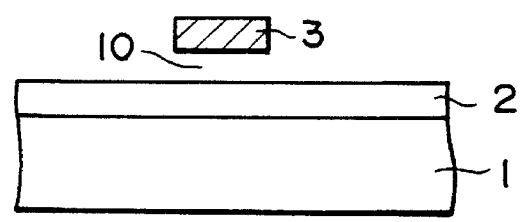
Figure 8D:
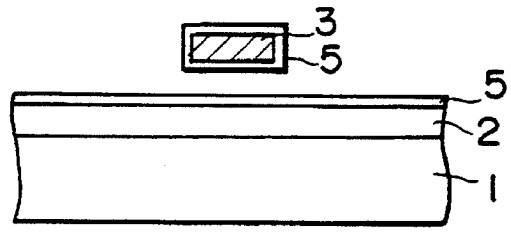
Figure 8E:
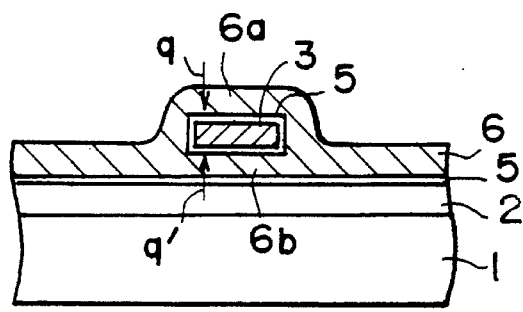
Figure 9:
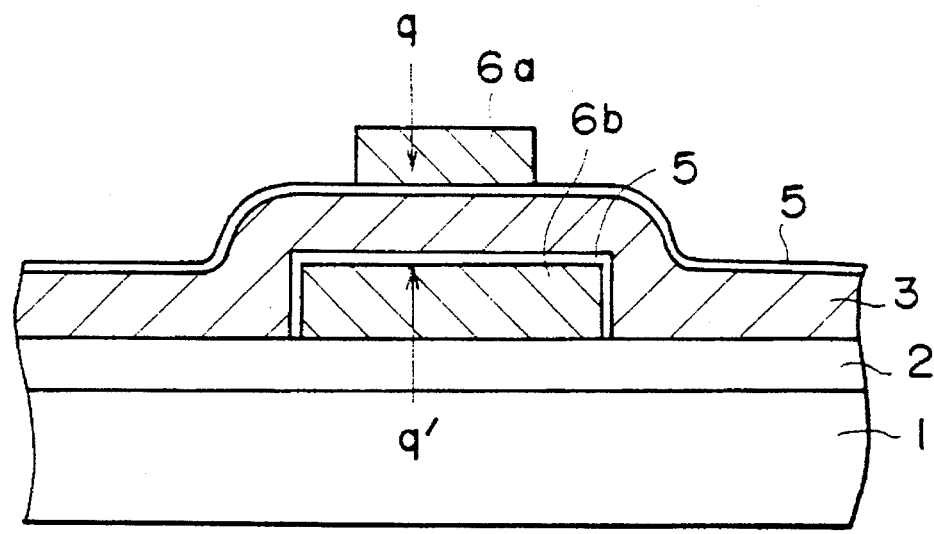

FIGS. 8A through 8E are each a cross-sectional view taken along a line corresponding to the line 8—8 of FIGS. 6C or 7C; FIGS. 8A, 8B, 8C and 8D are cross-sectional views of FIG. 6A, FIG. 6B, FIG. 6C and FIG. 7A, respectively, and FIG. 8E is a cross-sectional view of FIGS. 7B and 7C. FIG. 9 is a cross-sectional view taken along the line 9—9 of FIG. 7C.

The method of manufacturing the semiconductor device of this embodiment will now be described.

[Step A]

First silicon oxide film 2 having a predetermined thickness (e.g., about 1,000 Å) is formed on silicon substrate 1 by, for example, thermal oxidation, and silicon nitride film 9 having a predetermined thickness (e.g., about 2000 Å) is formed on the surface of first silicon oxide film 2 by LP-CVD (at a reaction temperature of 700° to 800° C., for example). Thereafter, silicon nitride film 9 is linearly patterned in accordance with the desired width of a channel of the transistor (FIGS. 6A, 8A).

[Step B]

Polysilicon film for forming channel silicon film 3 of the transistor is formed by LF-CVD (at a reaction temperature of 500° to 700° C., for example) on first silicon oxide film 2 and silicon nitride film 9 formed in Step A to a predetermined thickness (e.g., 500 Å), and into a desired pattern (FIGS. 6B, 8B).

[Step C]

Silicon nitride film 9 formed in Step A is entirely removed by, for example, being immersed in hot phosphoric acid at 150° C. (FIGS. 6C, 8C). Channel silicon film 3 has a rising portion formed at a position where silicon nitride film 9 passes under channel silicon film 3. When silicon nitride film 9 is removed, space 10 is formed under this portion of channel silicon film 3, as shown in FIGS. 6C and 8C. Thus, space 10 for sandwiching channel silicon film 3 between portions of the gate electrode can be formed even though no opening 4 is provided. First silicon oxide film 2 on silicon substrate 1 remains intact since the phosphoric acid solution has no effect on the silicon oxide film.

[Step D]

Second silicon oxide film 5 to be used as a gate insulation film is deposited by LP-CVD (at a reaction temperature of 400° to 900° C., for example) over the entire surface to a predetermined thickness (e.g., 200 Å). Second silicon oxide film 5 is thereby formed around the bridge-like channel silicon film portion 3 as well as on first silicon oxide film 2 (FIGS. 7A, 8B).

[Step E]

Second polysilicon film (doped polysilicon film) 12 to which phosphorus is added is deposited by LP-CVD (using SiH$_4$ gas containing PH$_3$ at a reaction temperature of 500° to 700° C., for example) on second silicon oxide film 5 formed in Step D to a predetermined thickness (e.g., about 2,000 Å). Space 10 (having a height of about 2,000 Å) under the bridge-like channel silicon film 3 portion is completely filled with second polysilicon film 1 2 (FIGS. 7B, 8E), because the coverage of LP-CVD for forming deposited film is very broad.

[Step F]

Second polysilicon film 12 is worked into a shape corresponding to a desired pattern to form gate electrode 6. That is, the portion of second doped polysilicon film 12 forming gate electrode 6 is formed in accordance with the desired pattern (FIG. 7C). As a result, channel silicon film 3 is covered by gate electrode 6, as shown in FIG. 8E. Referring to the cross-sectional view of FIG. 9 taken along the line 9—9 of FIG. 7C, a lower gate electrode portion 6b is longer than an upper gate electrode portion 6a. Next, arsenic is injected from above by using gate electrode 6 laid on channel silicon film 3 as a mask. Source and drain electrodes of the transistor are thereby formed, thus completing the GAA transistor.

As described above, in the method of forming the semiconductor device of Embodiment 2, space 10 is provided between channel silicon film 3 and first silicon oxide film 2 to form gate electrode 6 of the GAA transistor without forming an opening on the substrate so that the manufacturing process can be simplified. Also, the present invention makes it possible to precisely form transistors so that the integration density is increased.

In Embodiments 1 and 2, space 10 is formed using a silicon nitride film. However, any other material may be used to form space 10, as long as it can be selectively removed afterward by wet etching without affecting channel silicon film 3 and other members. However, it is desirable to use a material that would be durable under heating (at a temperature of about 600° C.) in the LP-CVD step between the steps for depositing and removing the material.

In the step of removing the silicon nitride film, it is not always necessary to remove all of the silicon nitride film. That is, some silicon nitride film may be left if necessary space 10 is formed under channel silicon film 3 and if electrode 6 can be formed so that channel silicon film 3 is suitably sandwiched between electrode 6 portions.

The semiconductor device having a GAA transistor has been described by way of example. The present invention, however, can also be applied to manufacture of semiconductor devices having other kinds of openings as well as those having thin film transistors. A process using LP-CVD has been described. However, needless to say, any other thin film forming methods may be used.

(Embodiment 3)

Figure 10:
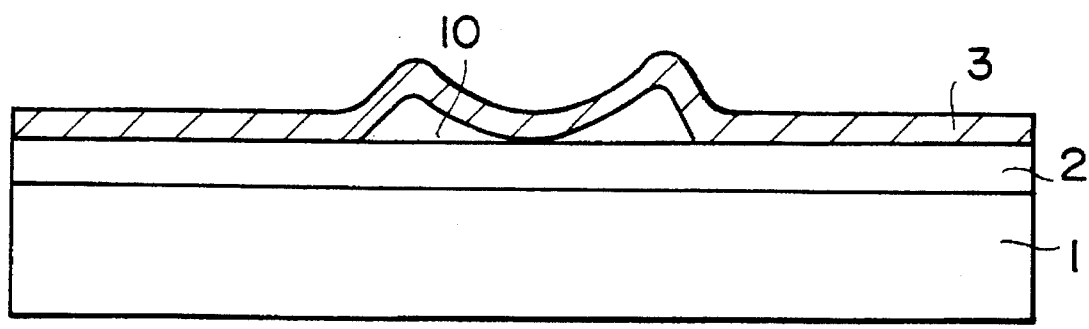
FIG. 10 is a diagram of drooping of channel silicon film.

In Embodiment 2, when channel silicon film 3 is formed into a bridge-like shape such as shown in FIG. 6C, there is a possibility that a central portion of the bridge-like portion may droop and contact first silicon oxide film 2 (hereinafter referred to simply as "droop"), as shown in FIG. 10. Such a droop occurs mainly because opposite bridge end portions of channel silicon film 3 (extending perpendicular to silicon substrate 1 to support the bridge) are not thick enough to support the bridge. Such a drooping can occur more readily if the channel length (bridge length) is longer, if the height of the bridge is shorter, or if the thickness of channel silicon film 3 is smaller.

Figure 11A:
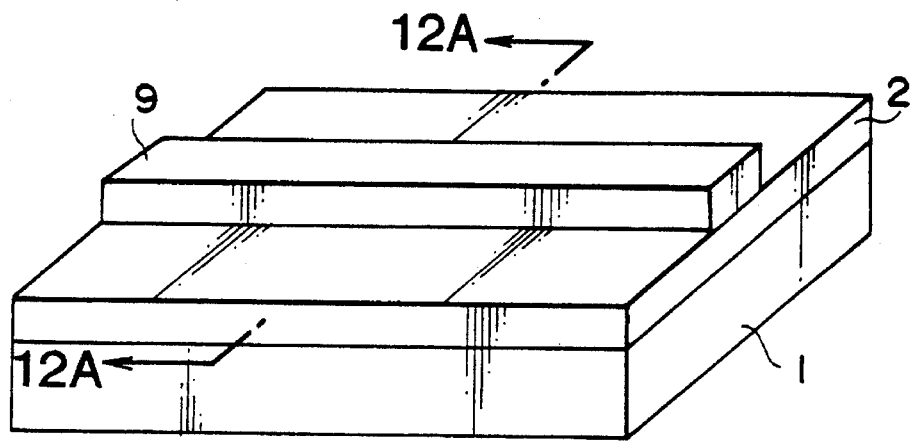
FIGS. 11A through 11D are diagrams showing a semiconductor device and a method of manufacturing the semiconductor device in accordance with a third embodiment of the present invention.
Figure 11B:
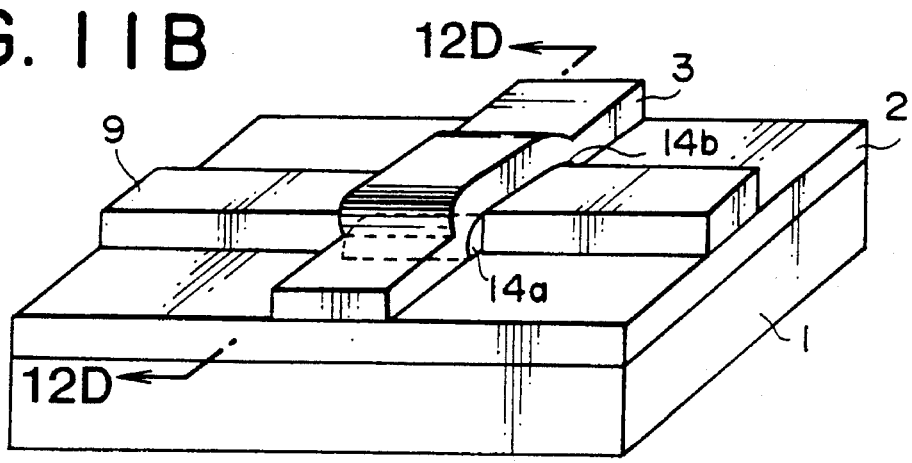
Figure 11C:
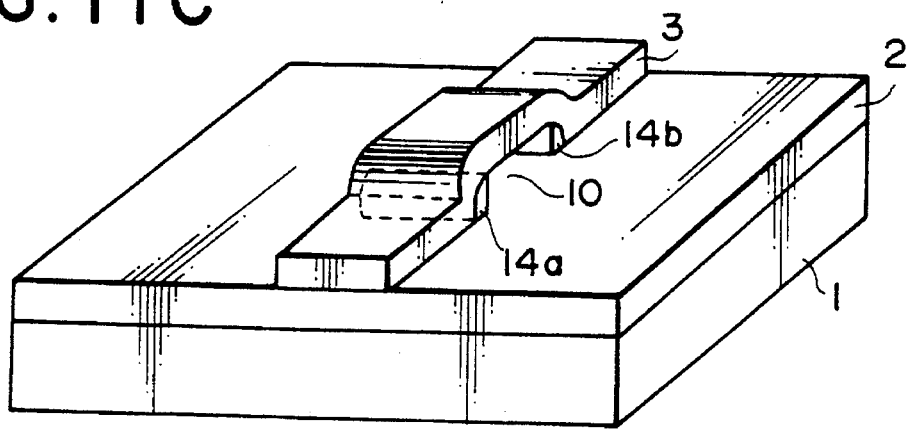

In Embodiment 3, as shown in FIG. 11C, frame patterns of silicon oxide film 13 are provided adjacent to leg portions of channel silicon film 3 to sufficiently support the bridge so that the bridge does not droop. The leg portions of channel silicon film 3 and frame patterns 14a and 14b support the bridge portion of channel silicon film 3.

The method of manufacturing the semiconductor device of Embodiment 3 will next be described.

Figure 12A:
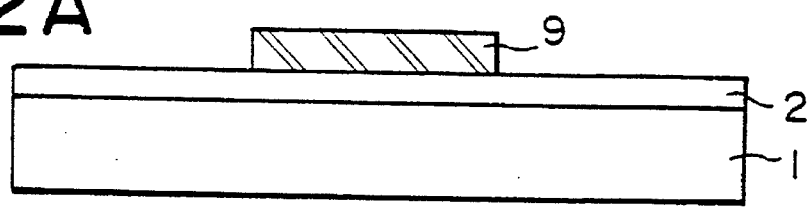
FIGS. 12A through 12F are cross-sectional views of the semiconductor device and the manufacturing method of the third embodiment of the invention.

Silicon nitride film 9 for forming space 10 by making a bridge-like shape of channel silicon film 3 is formed on first silicon oxide film 2 laid over silicon substrate 1 (FIG. 11A), as in Embodiment 2. FIG. 12A is a cross-sectional view of the members in this state taken along the line 12—12 of FIG. 11A.

Figure 12B:
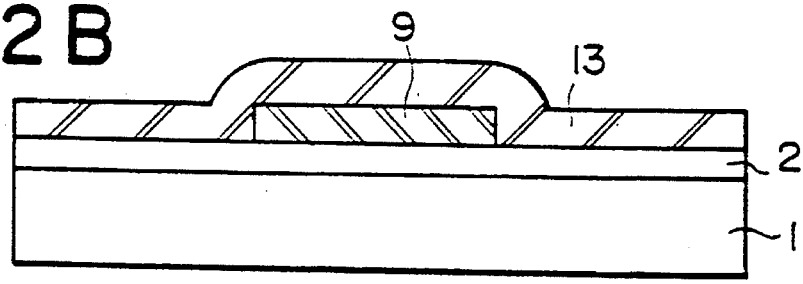
Figure 12C:
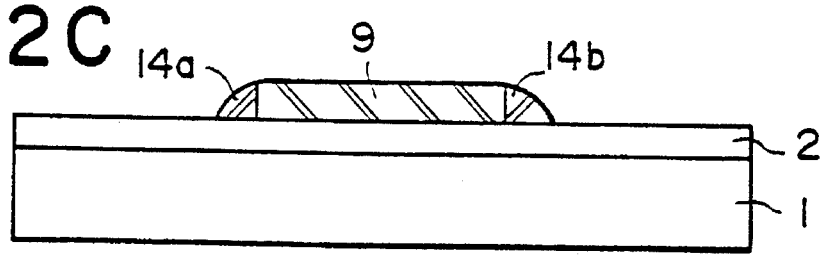

Next, silicon oxide film 13 is deposited over the entire surface by CVD to have a thickness of about 1,000 Å (FIG. 12B). Thereafter, silicon oxide film 13 is etched by anisotropic dry etching such as reactive ion etching to leave portions of silicon oxide film 13 in the form of side walls adjacent to side surfaces of silicon nitride film 9. These films portions are formed as frame patterns 14a and 14b (FIG. 12C).

Figure 12D:
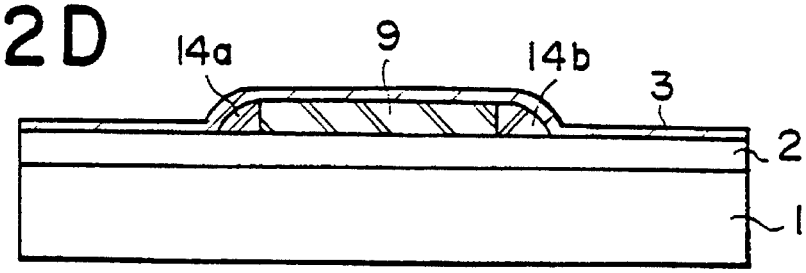
Figure 12E:
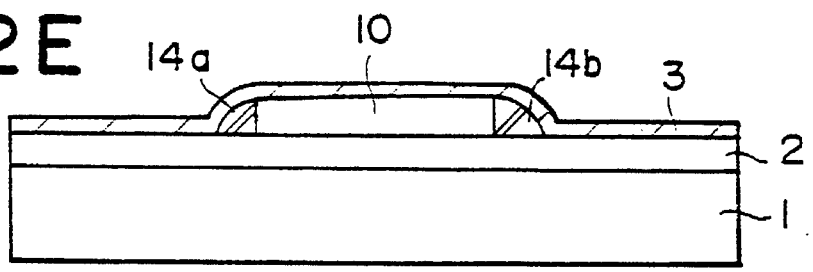

Thereafter, channel silicon film 3 is formed in accordance with a desired pattern by deposition (FIGS. 11B, 12D). When silicon nitride film 9 is removed, bridge-like channel silicon film 3 reinforced by frame patterns 14a and 14b is obtained (FIGS. 11C, 12E). Frame patterns 14a and 14b support the bridge portion of channel silicon film 3 so that drooping thereof cannot occur easily.

Figure 11D:
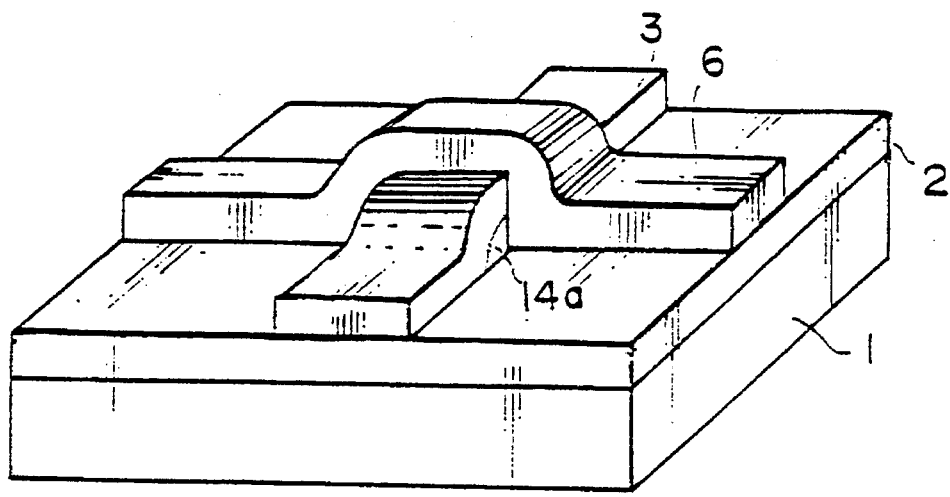
Figure 12F:
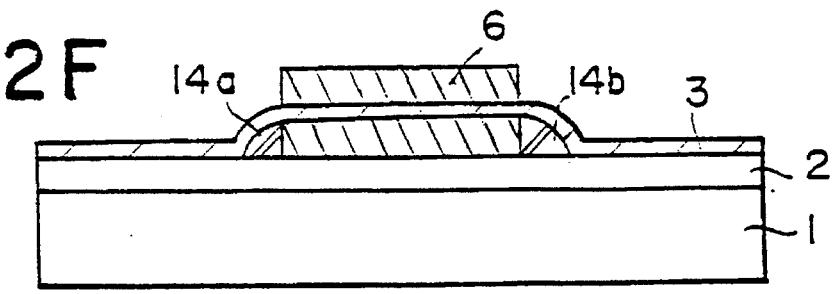

Finally, as shown in FIGS. 11D and 12F, the gate electrode 6 is formed, completely surrounding the channel silicon film 3. Since frame patterns 14a and 14b are provided at the opposite ends of the bridge, they do not impede the channel formation by gate electrode 6.

(Embodiment 4)

In Embodiment 3, frame patterns of silicon oxide film are provided at the opposite ends of the bridge to prevent drooping in the bridge. However, the arrangement may alternatively be such that silicon nitride film 9 between the bridge and the silicon substrate is not removed entirely, and some portion of silicon nitride film 9 is left as a support for the bridge to prevent drooping therein. For example, silicon nitride film 9 having a thickness of about 100 Å may be left as a suitable support for the bridge.

The method of manufacturing the semiconductor device of Embodiment 4 will next be described.

Figure 13A:
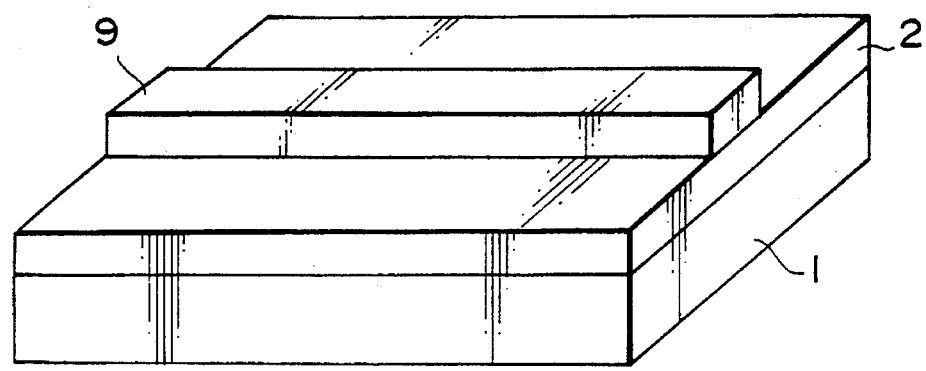
FIGS. 13A through 13C are diagrams showing a semiconductor device and a method of manufacturing the semiconductor device in accordance with a fourth embodiment of the present invention.
Figure 13B:
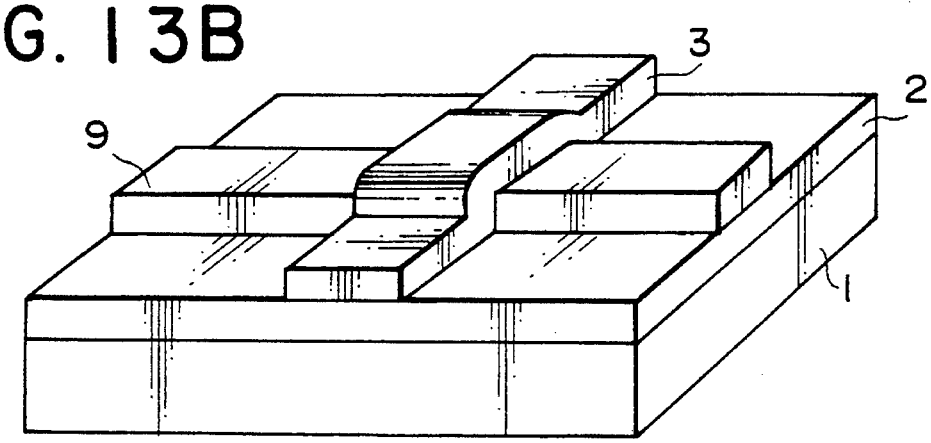
Figure 13C:
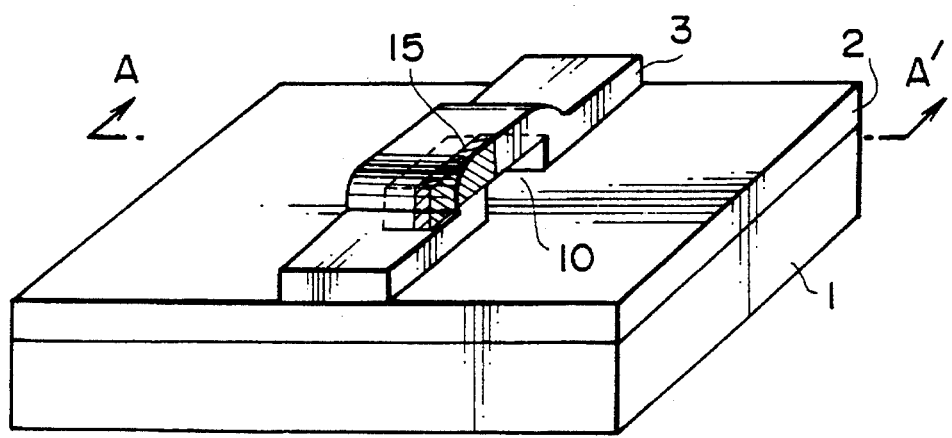
Figure 14A:
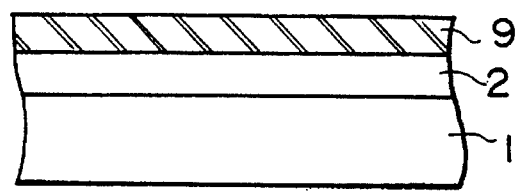
FIG. 14A through 14E are cross-sectional views of the semiconductor device and the manufacturing method of the fourth embodiment of the invention.
Figure 14B:
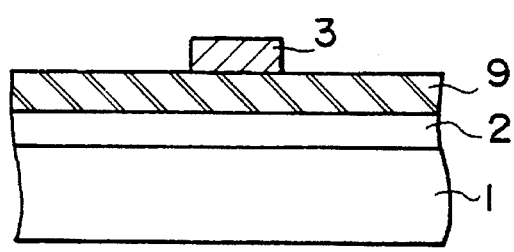
Figure 14C:
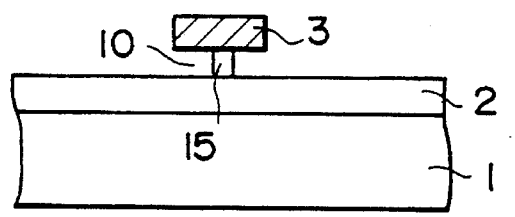

Channel silicon film 3 is formed on silicon nitride film 9 by the step of Embodiment 2 (FIGS. 13B, 14B). In the next step of removing silicon nitride film 9 with hot phosphoric acid, the immersion time in the etching liquid is set so as to be slightly shorter than the time taken to completely remove silicon nitride film 9, thereby enabling a portion of silicon nitride film 9 to remain and act as a bridge support 15 (FIGS. 13C, 14C). Since the silicon nitride film 9 under the bridge is etched from the opposite sides of the bridge, the bridge support 15 is formed generally at a center of the bridge.

Figure 14D:
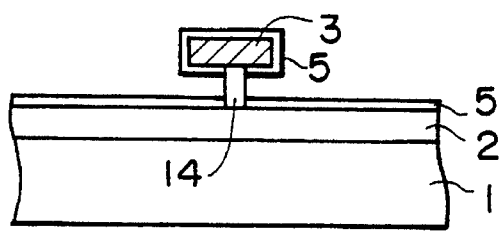
Figure 14E:
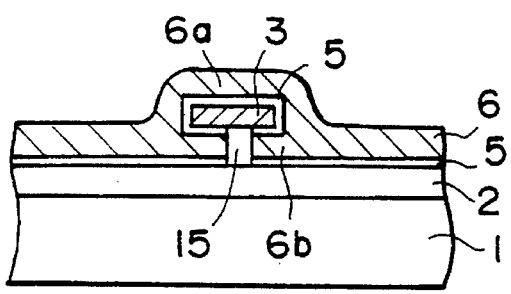

Subsequent steps are the same as those of Embodiment 2 (FIGS. 14D, 14E).

As can be understood from FIG. 13C, support 15, extending the length of the bridge, i.e., the length of the channel, is parallel to the current which flows through channel silicon film 3 and, therefore, does not seriously impede the current through the channel even if it inhibits channel formation in some portion of channel silicon film 3.

Embodiment 4 described above can also be applied to a semiconductor device having the same opening as that of Embodiment 1.

(Embodiment 5)

Figure 15:
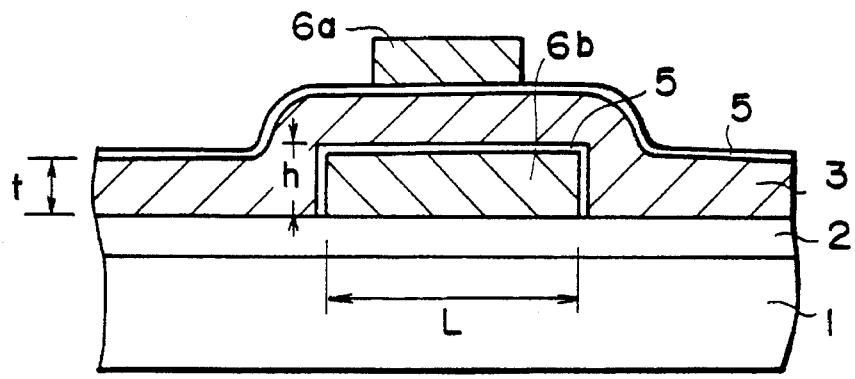
FIG. 15 is a sectional view of the semiconductor device of the fifth embodiment of the invention.

In Embodiments 3 and 4, droop in the bridge-like portion of channel silicon film 3 is prevented by supporting the bridge portion with frame patterns 14 or support 15. Alternatively, the shape of the bridge may be designed to prevent drooping. Assuming that, as shown in FIG. 15, the length of the channel is L, the height of the bridge is h and the thickness of channel silicon film 3 is t, drooping of channel silicon film 3 can occur more easily if the channel length L is longer.

Figure 16:
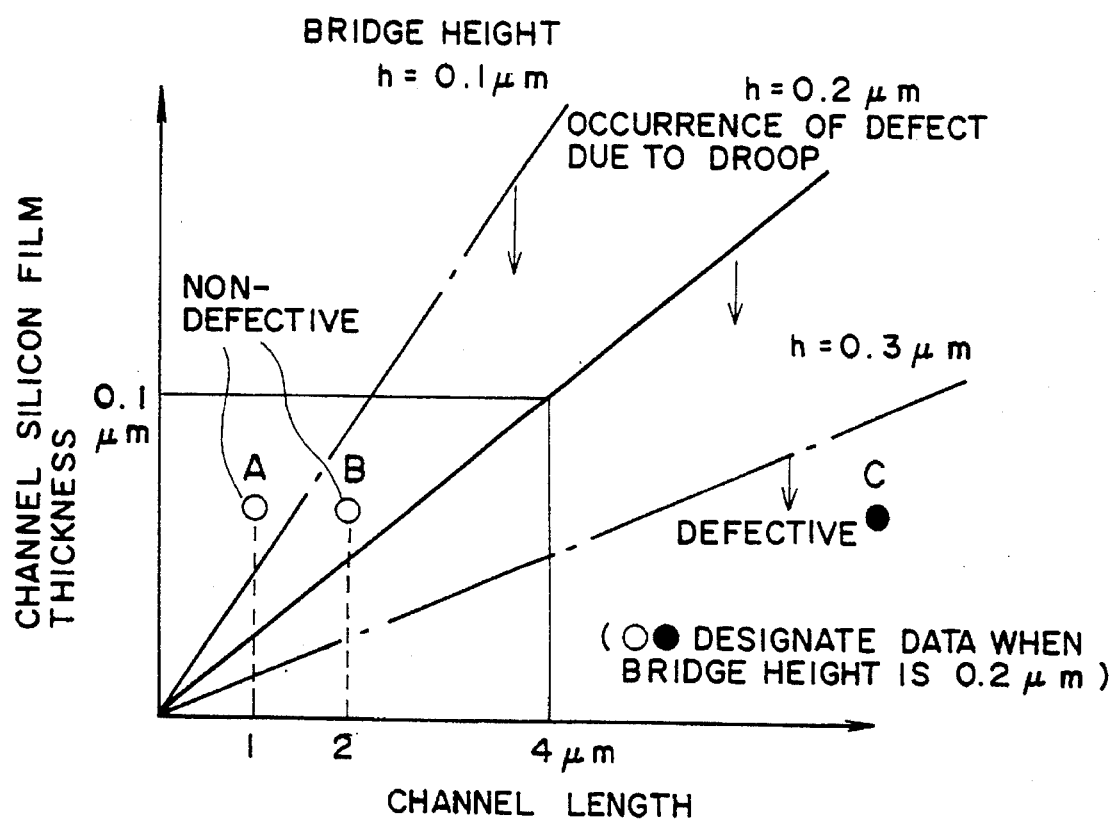
FIG. 16 is a graph of the relationship between a channel length L, channel silicon film thickness t, a bridge height h and occurrence of drooping of the bridge in the semiconductor device of the fifth and sixth embodiments of the present invention.

FIG. 16 shows several results of an experiment. Plots A to C indicate the results obtained when the height h of the bridge was set to 0.2 μm. Plot A indicates the result when the channel length L=1 μm and channel silicon film 3 thickness t=0.06 μm. Under these conditions, no drooping occurs. Plot B indicates the result when the channel length L=2 μm and channel silicon film thickness t=0.06 μm. Also under these conditions, no drooping occurs. Plot C indicates the result when the channel length L=8 μm and channel silicon film 3 thickness t=0.06 μm. Under these conditions, drooping occurs.

According to these experimental results, drooping occurs if the channel length L is 40 times the thickness of channel silicon film 3 or more when the height h of the bridge is 0.2 μm. That is, drooping occurs when the factors are in the region under a boundary represented by a solid straight line t (μm)=L(μm)/40 in FIG. 16, while no drooping occurs when the factors are in the region over the boundary. As can be understood from these results, the channel length L may be set to a value not larger than 40 times the thickness t of channel silicon film 3.

$$L \leq 40t$$

FIG. 16 also shows dotted lines representing limits at which drooping occurs when bridge height h=0.1 μm and when h=0.3 μm, respectively.

Figure 17A:
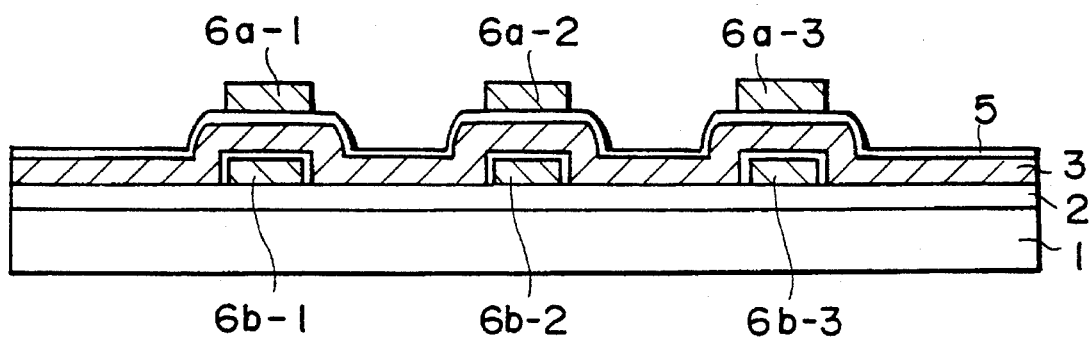
FIGS. 17A and 17B are a cross-sectional view and a plan view, respectively, of the semiconductor device of the fifth embodiment of the invention.
Figure 17B:
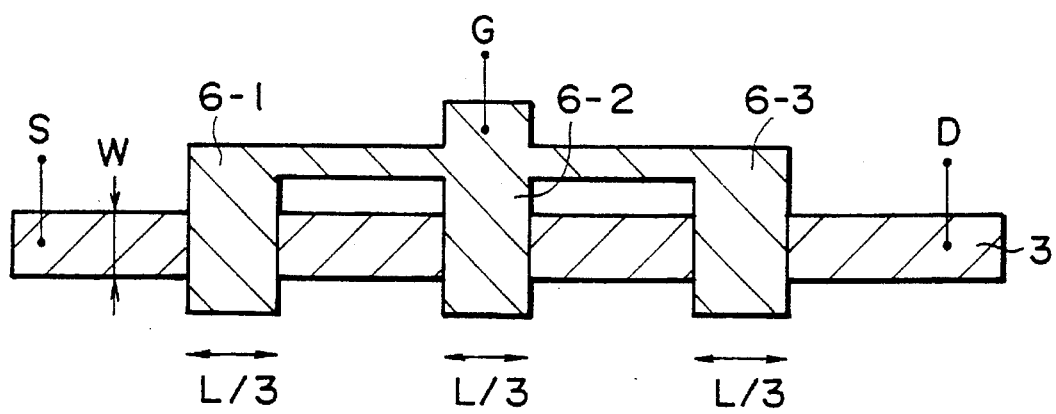

If a transistor having a long channel length L is required, it is possible that the above-described condition cannot be satisfied. In such a case, one transistor may be formed from three transistors having shorter channel lengths of L/3 satisfying the above condition, as shown in the cross-sectional view of FIG. 17A and the plan view of FIG. 17B. In this case, the gates of the three transistors are connected with each other in parallel and the three transistors are driven by one gate signal. The number of divisional transistors is not limited to 3; it may be 2, 4, 5 and so on.

Embodiment 5 described above can also be applied to a semiconductor device having the same opening as that of Embodiment 1.

(Embodiment 6)

In Embodiment 5, the shape of the bridge is determined by considering the relationship between the channel length L and the channel silicon film thickness t. It may alternatively be determined so as to prevent drooping by considering the relationship between the channel length L and the bridge height h.

In general, if the height h of the bridge is high, the possibility of channel silicon film 3 drooping to contact first silicon oxide film 2 is small because the spacing between channel silicon film 3 and first silicon oxide film 2 is sufficiently large. Gate electrode 6 can be formed so as to surround channel silicon film 3 to form a GAA transistor as long as channel silicon film 3 and first silicon oxide film 2 do not contact each other. In the results of the experiment shown in FIG. 16, the channel length L=4 μm and the bridge height h=0.2 μm and a droop occurrence limit is reached when the channel silicon film thickness t=0.1 μm. When the bridge height h is higher than 0.2 μm, no drooping occurs. Conversely, when the bridge height h is lower than 0.2 μm, drooping occurs. Accordingly, the height h of the bridge may be set to a value equal to or larger than 20 times of the channel length L.

$$L \leq 20h$$

Embodiment 6 described above can also be applied to a semiconductor device having the same opening as that of Embodiment 1.

(Embodiment 7)

Figure 18A:
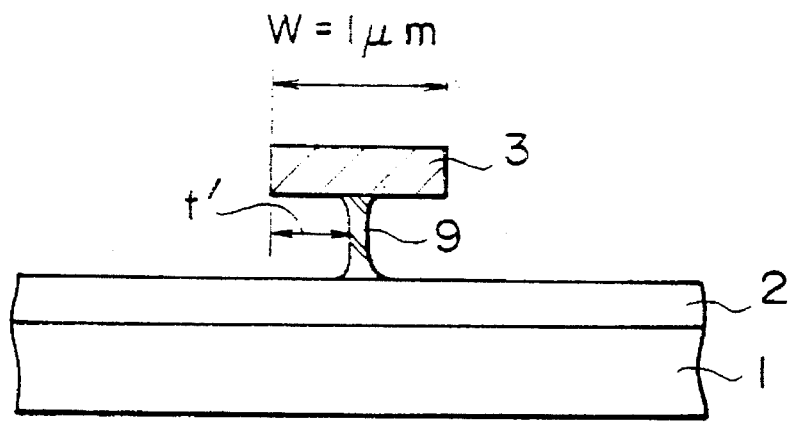
FIGS. 18A and 18F are diagrams of a semiconductor device in accordance with a seventh embodiment of the present invention.
Figure 18B:
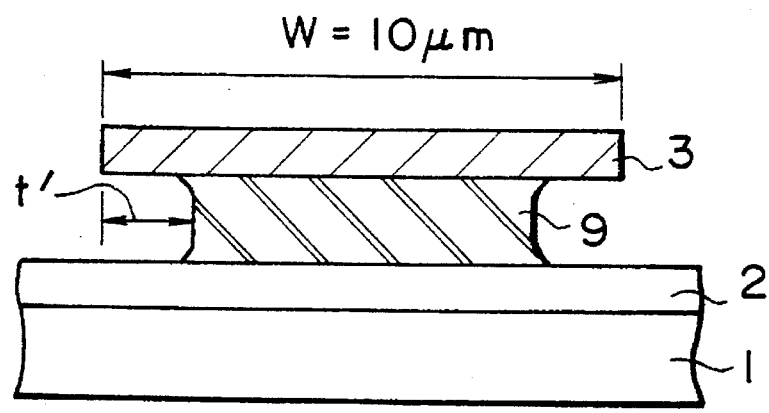

In Embodiments 1 and 2, silicon nitride film 9 (film 8 in Embodiment 1) is removed by using hot phosphoric acid. In this etching, silicon nitride film 9 under channel silicon film 3 is etched only in lateral directions. Accordingly, if silicon nitride film 9 is to be completely removed at this position, then it is necessary to etch for a predetermined time selected according to the channel width W. However, if a plurality of transistors formed on one silicon substrate vary in channel width W throughout a substantially wide range, there is the possibility of failure to completely remove silicon nitride film 9 of the transistors having wider channel widths W. For example, in a case where the channel width W is 1 μm as shown in FIG. 18A, the etched width t' may be set to at most about 0.5 μm. On the other hand, in a case where the channel width W is 10 μm, silicon nitride film 9 is not sufficiently removed if the etched width t' is about 0.5 μm.

This problem can be solved in such a manner that in the case where a transistor having a large channel width W is required, this transistor may be formed by two or more divisional transistors having narrower channel widths W.

Figure 19A:
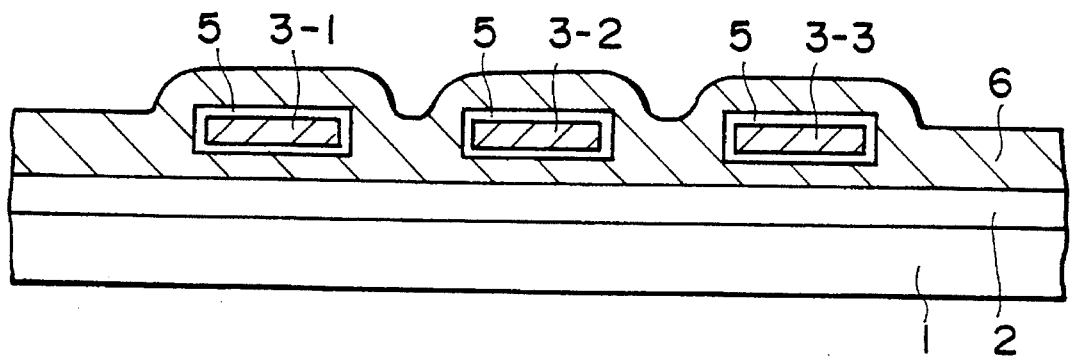
FIGS. 19A and 19B are a cross-sectional view and a plan view, respectively, of the semiconductor device of the seventh embodiment of the invention.
Figure 19B:
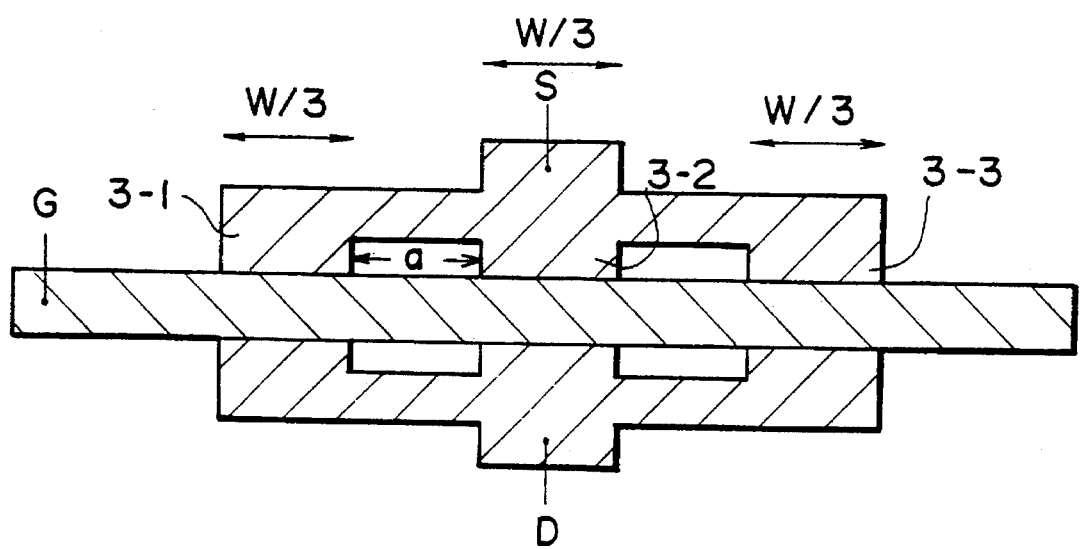

For example, as shown in the cross-sectional view of FIG. 19A and the plan view of FIG. 19B, one transistor may be formed by three transistors having smaller channel widths of W/3, assuming that the channel width W/3 is equal to that other transistors (not shown). Sources and drains of these three transistors are connected in parallel with each other and the three transistors are driven by one common gate signal. The number of divisional transistors in such a case is not limited to 3; it may be 2, 4, 5 and so on.

In this arrangement, it is desirable to set the spacing a between the channel silicon films 3-1 and 3-2 and between channel silicon films 3-2 and 3-3 to 0.5 μm or higher, because it must be large enough to allow permeation of hot phosphoric acid for wet etching.

Embodiment 7 described above can also be applied to a semiconductor device having the same opening as that of Embodiment 1.

(Embodiment 8)

The material of channel silicon film 3 is polysilicon containing many grains (crystal grains). There are therefore problems of an increase in leakage current in the off state and a reduction in drain current in the on state due to grain boundaries between the grains and lattice defects. In Embodiment 8, a manufacturing method is provided in which channel silicon film 3 in the structure of Embodiment 1 or 2 is processed by thermal oxidation to improve the electrical characteristics.

More specifically, in the case of Embodiment 1, channel silicon film 3 is processed by thermal oxidation in a dry $O_2$ or wet $O_2$ atmosphere at 700° to 1,000° C. after Step D shown in FIG. 2A, in which channel silicon film 3 is formed over opening 4. In the case of Embodiment 2, the same treatment may be performed after Step C shown in FIG. 6C, in which channel silicon film 3 is formed like a bridge.

By this treatment, bridge-like channel silicon 3 undergoes thermal oxidation on all of the upper, lower, left and right surfaces. Silicon atoms are released as surplus silicon from portions thereby oxidized. This surplus silicon combines with silicon atoms in lattice defect portions, thereby eliminating lattice defects. Also, surplus silicon combines with silicon atoms at the grain boundaries to reduce lattice defects thereon, thereby reducing the influence of the grain boundaries.

The effects of improving crystallographic properties achieved by this thermal oxidation are higher if the amount of surplus silicon is larger. Accordingly, it is desirable to perform the thermal oxidation treatment under the condition that the four surfaces of channel silicon film 3 are exposed, as mentioned above. Thus, the manufacturing method of Embodiment 8 uses a four-sided thermal oxidation treatment to achieve very high treatment effects in comparison with the conventional thermal oxidation treatment in which the silicon film undergoes thermal oxidation only on its upper surface.

If thermal oxidation is performed in this manner, the crystallographic and electrical properties can be improved.

The heat-oxidized film thereby formed may be used directly as a gate insulation film of a transistor or may be removed for the formation of a gate insulation film separately formed by CVD or the like.

(Embodiment 9)

In Embodiments 1 and 2, channel silicon film 3 is in direct contact with silicon nitride film 9 provided as a dummy material, as shown in FIGS. 1C and 6B. In this state, nitrogen in silicon nitride film 9 may enter channel silicon film 3 acting as a donor, which may reduce the stable electrical characteristics of channel silicon film 3. In this embodiment, therefore, an oxidized film is formed between channel silicon film 3 and silicon nitride film 9 to prevent direct contact between these films and, hence, such a drawback.

An example of the manufacturing method in accordance with this embodiment will next be described. For ease of description, the process of manufacturing the transistor of Embodiment 3 will be described by way of example.

Figure 20A:
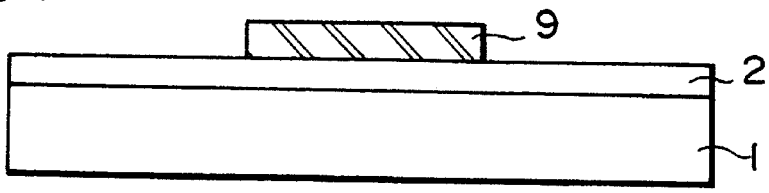
FIGS. 20A through 20D, and 21A through 21D are diagrams showing a method of manufacturing a semiconductor device in accordance with a ninth embodiment of the present invention.
Figure 20B:
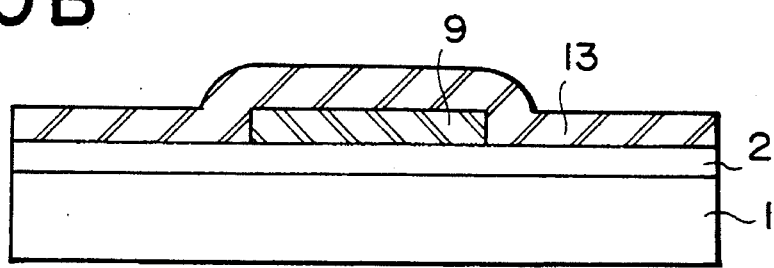
Figure 20C:
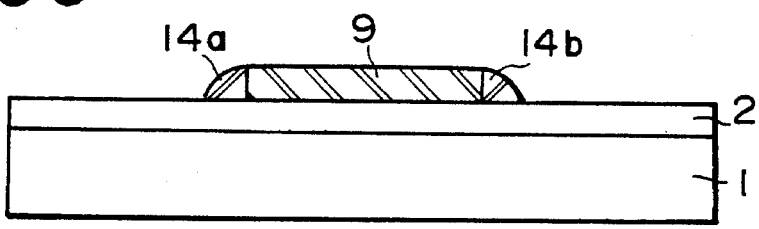

First, silicon nitride film 9 is formed on first silicon oxide film 2 laid over silicon substrate 1 (FIG. 20A). Next, silicon oxide film 13 is formed (FIG. 20B). Silicon oxide film 13 is thereafter etched by reactive ion etching to form frame patterns 14a and 14b in the form of side walls adjacent to the side surfaces of the silicon nitride film (FIG. 20C). These steps are the same as those of Embodiment 3.

Figure 20D:
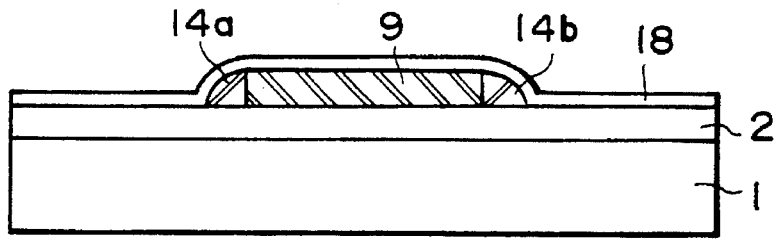

Next, silicon oxide film 18, not used in Embodiment 3, is formed on first silicon oxide film 2, silicon nitride film 9 and frame patterns 14a and 14b by CVD to a thickness of 200 Å (FIG. 20D) before channel silicon film 3 is formed.

Figure 21A:
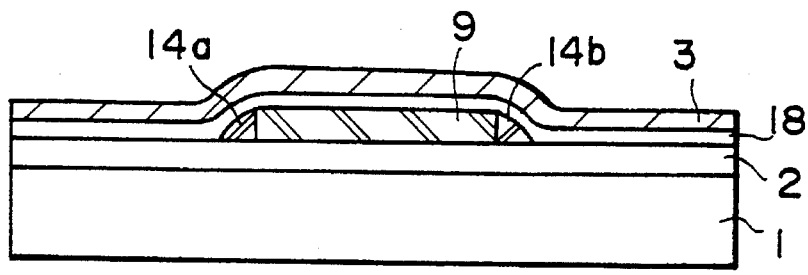
Figure 21B:
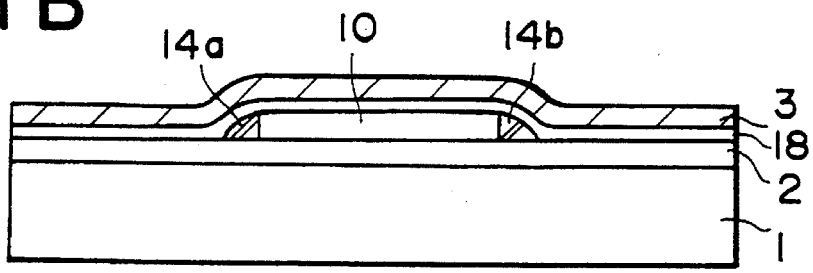
Figure 21C:
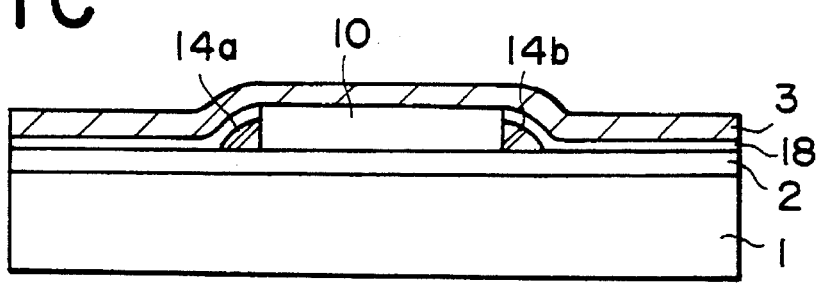
Figure 21D:
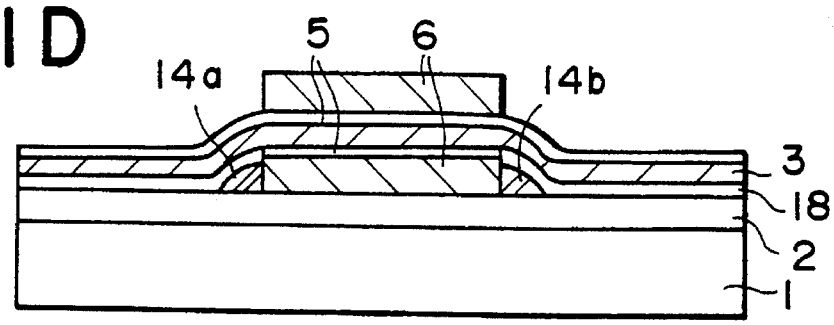

Thereafter, channel silicon film 3 is formed on silicon oxide film 18 (FIG. 21A). Next, silicon nitride film 9 is removed by etching (FIG. 21B). Further, silicon oxide film 18 exposed at space 10 is removed by using hydrofluoric acid (FIG. 21C). Subsequently, second silicon oxide film 5 and gate electrode 6 are formed in the same manner as Embodiment 3 (FIG. 21D).

Oxide film 18 at the bridge portion is removed in the step shown in FIG. 21C for the purpose of preventing the occurrence of a non-uniformity in the thickness of the oxide film for the gate on the portion where a channel is formed. If oxide film 18 is not removed, the thickness of the oxide film on the space 10 side is the sum of the thickness of second silicon oxide film 2 and the thickness of oxide film 18, when second silicon oxide film 5 is formed as shown in FIG. 21D. On the other hand, the thickness of the oxide film on the side remote from space 10 is determined by the thickness of second silicon oxide film 5. As a result, the thicknesses of oxide film for the gate electrode 6 on the upper and lower sides of channel silicon film 3 differ from each other. In a GAA transistor, it is desirable that the thickness of the oxide film be thinner and that channel characteristics be uniform between the upper and lower sides.

If the thickness of silicon oxide film 18 is small enough to avoid problems in terms of transistor characteristics, then the step for removing silicon oxide film 18, shown in FIG. 21C, may be removed.

(Embodiment 10)

In Embodiments 1 and 2, the rate at which silicon nitride film 9 is removed by using hot phosphoric acid is very low, about 50 Å per minute. A long processing time is therefore required for this etching. For example, if the gate width W of the transistor is 0.6 µm, the time required for etching is about 120 minutes.

In Embodiment 10, silicon nitride film is formed in Step B of Embodiment 1 or Step A of Embodiment 2 by using plasma CVD instead of LP-CVD, thereby reducing the etching time. The density of a silicon nitride film deposited by plasma CVD is so low that the rate at which this silicon nitride film is etched by hot phosphoric acid is 50% or more higher than the rate at which silicon nitride film deposited by LP-CVD is etched. Accordingly, the time taken to remove silicon nitride film 8 or 9 in Embodiment 1 or 2 can be reduced to half.

(Embodiment 11)

In the steps of Embodiment 2 shown in FIGS. 6A through 6D, first silicon oxide film 2 provided as a base may be replaced with a silicon nitride film formed by LP-CVD while silicon nitride film 9 is replaced with a silicon oxide film formed by LP-CVD. Since silicon oxide can be etched by hydrofluoric acid, the bridge can be formed by using hydrofluoric acid. In such a case, the bridge can be formed in a short time because silicon oxide can be etched at a high rate, 500 to 6,000 Å per minute.

To achieve the same effect, in the steps of Embodiment 1 shown in FIGS. 1A through 1C, first silicon oxide film 2 provided as a base may be replaced with a silicon nitride film formed by LP-CVD and silicon nitride film 8 is replaced with a silicon oxide film formed by LP-CVD.

(Embodiment 12)

In the steps of Embodiment 2 shown in FIGS. 6A through 6D, a film of boron silicate glass (BSG), phosphorus silicate glass (PSG) or the like containing an impurity may be used instead of silicon nitride film 9 while the same first silicon oxide film 2 provided as a base is used. BSG is a silicon oxide film containing boron, and PSG is a silicon oxide film containing phosphorus. Each BSG and PSG film is formed by CVD and is etched by hydrofluoric acid. The rate at which each of these films is etched is at least twice the rate at which the other silicon oxide film is etched. Moreover, BSG or PSG can be selectively removed by this etching. The selection ratio of BSG and the other silicon oxide film is about 40.

Consequently, according to this embodiment, the time taken to remove silicon nitride film 9 in Embodiment 2 can be reduced to half.

In the steps of Embodiment 1 shown in FIGS. 1A through 1C, silicon nitride film 8 may be replaced with BSG or PSG to achieve the same effect.

(Embodiment 13)

In Embodiments 1 and 2, the gate silicon film is formed after the channel silicon film has been formed. However, this order may be reversed so that the channel silicon film is formed after the gate silicon film.

The method of manufacturing the transistor of this embodiment will be described with reference to FIGS. 22A through 22E similar to FIGS. 8A through 8E of Embodiment 2.

Figure 22A:
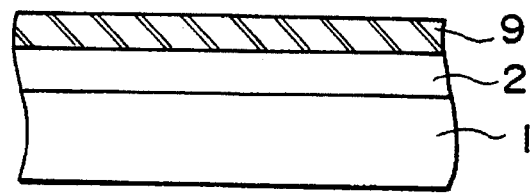
FIGS. 22A through 22E are diagrams showing a method of manufacturing a semiconductor device in accordance with a thirteenth embodiment of the present invention.
Figure 22B:
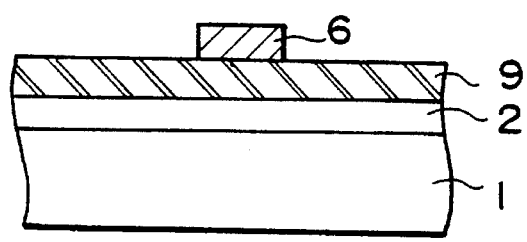
Figure 22C:
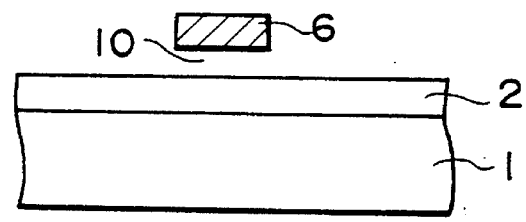
Figure 22D:
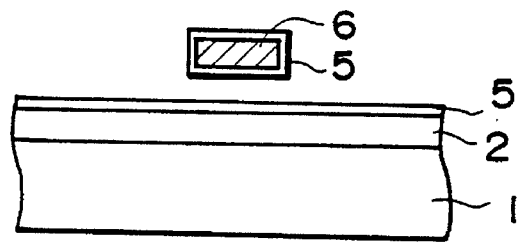

Silicon nitride film 9 is formed on first silicon oxide film 2 laid over silicon substrate 1 (FIG. 22A). Thereafter, polysilicon is deposited on silicon nitride film 9 to form gate electrode 6 (FIG. 22B). Next, silicon nitride film 9 is removed by etching to form the gate electrode 6 like a bridge (FIG. 22C).

Figure 22E:
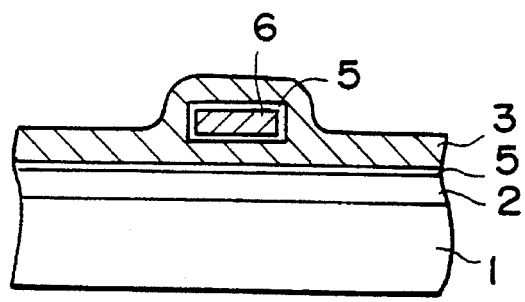

Subsequently, silicon oxide film 5 is formed on the surface (FIG. 22D), as in the case of Embodiment 2. Thereafter, channel silicon film 3 is formed so as to cover gate electrode 6 (FIG. 22E).

Thus, the method of this embodiment is such that channel silicon film 3 and gate silicon film 6 are mutually substituted for each other in the construction of Embodiment 2. In the structure of the transistor of this embodiment formed in this manner, channel silicon film 3 is wrapped around polysilicon film of gate electrode 6. In the transistor of this embodiment, a current flows through the entire sectional area of channel silicon film 3, so that the effect of the transistor of Embodiment 2 for obtaining a channel conductance twice as large as that of the ordinary transistor cannot be obtained. However, channel surfaces are respectively formed on the upper and lower sides of gate electrode 6, and two channels are formed between the source and the drain, thereby doubling the current drive capacity.

The manufacturing method of Embodiment 2 has been described by way of example. However, the same conception can also be applied to the manufacturing method of Embodiment 1.

(Embodiment 14)

In the conventional thin film transistors, the thickness of the channel silicon film is determined by the thickness of the polysilicon deposited by CVD, and the thickness of the channel portion alone cannot be increased. In Embodiment 14, it is possible to increase only the thickness of the channel portion based on the manufacturing method of Embodiment 13.

Figure 23:
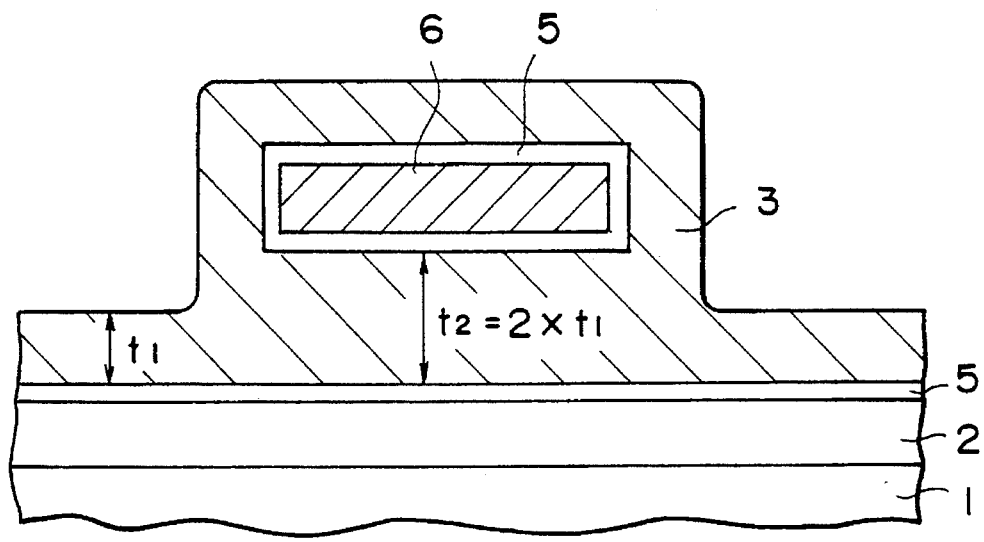
FIG. 23 is a cross-sectional view of a semiconductor device in accordance with a fourteenth embodiment of the present invention.

The thin film transistor (TFT) of this embodiment is characterized in that, as shown in FIG. 23, the height $t_2$ of gate electrode 6 formed like a bridge is equal to or smaller than a value twice as large as the thickness $t_1$ of channel silicon film 3.

If the height $t_2$ of gate electrode 6 and thickness $t_1$ of channel silicon film 3 are selected so as to satisfy $t_2 \leq t_1$, a thin film transistor having a structure such as that shown in FIG. 23 is formed. This process will be described with reference to FIGS. 25A through 25C.

Figure 25A:
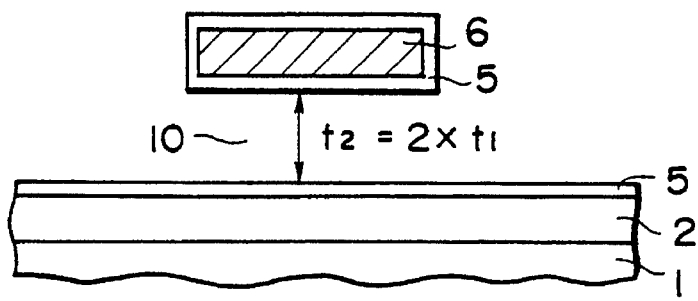
FIGS. 25A through 25C are cross-sectional views of a method of manufacturing the semiconductor device of the fourteenth embodiment of the invention.
Figure 25B:
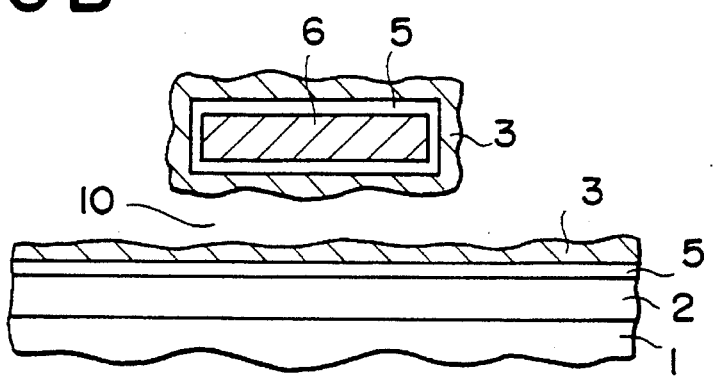
Figure 25C:
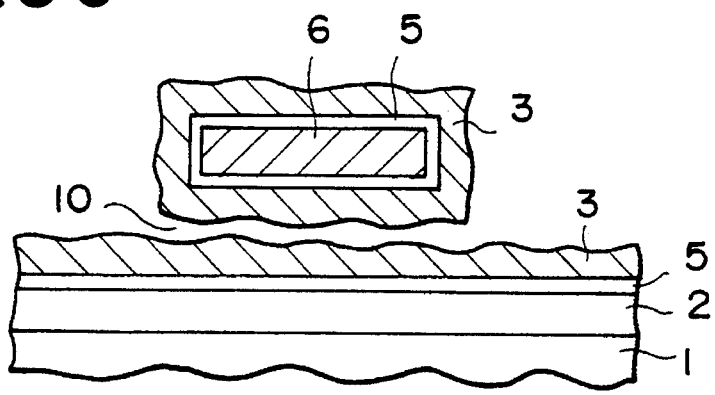

It is assumed here that the height $t_2$ of the bridge of gate electrode 6 is twice as high as the thickness $t_1$ of channel silicon film 3 deposited afterward (FIG. 25A). In the step of depositing channel silicon film 3 by CVD, channel silicon film 3 is deposited on second silicon oxide film 5 on silicon substrate 1, fully encapsulating gate electrode 6 (FIG. 25B). As this channel silicon film deposition process continues, the thickness of channel silicon film 3 is gradually increased (FIG. 25C). As can be understood from these figures, space 10 is closed by channel silicon film 3 deposited on the lower surface of gate electrode 6 and channel silicon film 3 deposited on silicon substrate 1. Accordingly, the growing speed of channel silicon film 3 in space 10 is about twice the growing speed on substrate 1 or the growing speed on the upper surface of gate electrode 6. For this reason, space 10 can be filled with channel silicon film 3 without a gap even if the height of gate electrode 6 is twice the thickness of channel silicon film 3.

Figure 24:
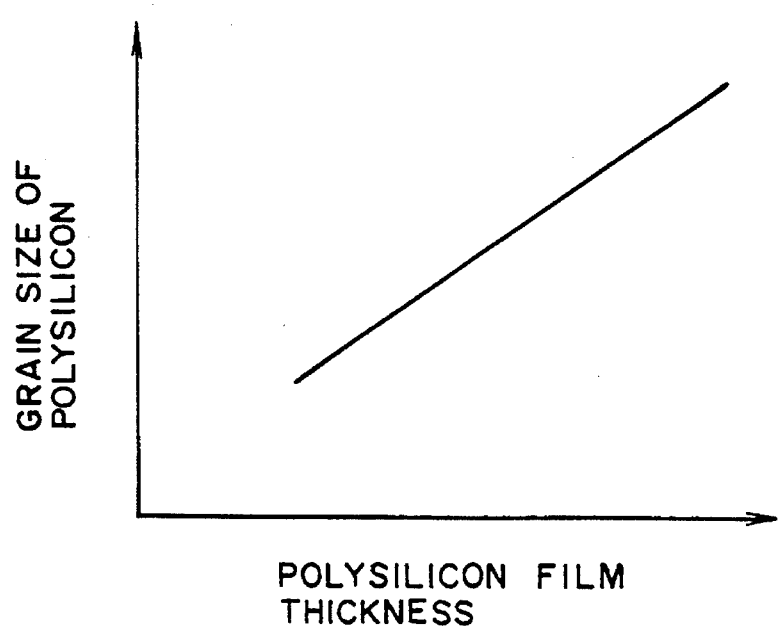
FIG. 24 is a graph showing the relationship between the polysilicon thickness and the polysilicon grain size in the semiconductor device of the fourteenth embodiment of the invention.

In general, the grain size of the polysilicon film becomes larger as the thickness of the polysilicon film becomes larger (FIG. 24). Therefore, the size of the grains in the portion of channel silicon film 3 between silicon substrate 1 and gate electrode 6 where a channel is formed is larger than that of grains in other portions. Therefore, the drain current, when the transistor is on, can be increased, since in the TFT structure of Embodiment 14 the channel silicon film between silicon substrate 1 and gate electrode 6 is thicker. The drain current when the transistor is off is generated at the drain end and its magnitude is determined by the volume of current generating portion. Therefore, the drain current when the transistor is off is related to the thickness $t_1$ of channel silicon film 3 and is not related to the thickness $t_2$ of the channel portion. Consequently, the drain current when the transistor is off is not increased.

Moreover, since the film thickness $t_1$ of channel silicon film 3 is ½ of the film thickness $t_2$ of the channel portion, etching can be performed more easily in comparison with the case of forming channel silicon film 3 of thickness $t_2$ over the entire surface, and the patterning of channel silicon film 3 becomes easier.

If the height $t_2$ of the bridge of gate electrode 6 exceeds a value twice as large as the thickness $t_1$ of channel silicon film 3, space 10 under the bridge is not completely closed by the channel silicon film and a gap is formed therein.

As described above, the transistor manufactured by the method of Embodiment 14 is advantageous in that the drain current in the on state is increased while the drain current in the off state is limited, and in that the patterning facility is improved.

(Embodiment 15)

The structure of the transistors of Embodiments 13 and 14 manufactured by the process of forming the gate electrode before the channel silicon film is not a GAA structure. The method of manufacturing the transistor in accordance with Embodiment 15 uses a process of forming a gate electrode before channel silicon film but makes it possible to form gate electrode portions over and under the channel silicon film.

FIGS. 26A through 26C and FIGS. 27A through 27C are perspective views of the structure of the semiconductor device of this embodiment and the method of manufacturing the semiconductor device. FIGS. 28A through 28D and FIGS. 29A through 29D are cross-sectional views taken along the line 28—28 of FIG. 26C through line 29—29 in FIG. 27C. In these figures are illustrated first gate silicon film 22 superposed on first silicon oxide film 2 formed on silicon substrate 1, second gate silicon film 23 superposed on silicon oxide film 9 and first gate silicon film 22, and a resist film 24 for patterning first and second gate silicon films 22 and 23 to form a gate electrode.

The manufacturing method will be described.

[Step A]

Silicon oxide film 2 is formed on silicon substrate 1, for example, by thermal oxidation to have a thickness of about 1,000 Å. On the surface of silicon oxide film 2, first gate silicon film 22 to which phosphorus is added is deposited by LP-CVD (600° to 700° C.) to a thickness of, for example, 1,500 Å. Further, silicon nitride film 9 is deposited by LP-CVD (600° to 700° C.) to a thickness of, for example, 2,000 Å.

Figure 26A:
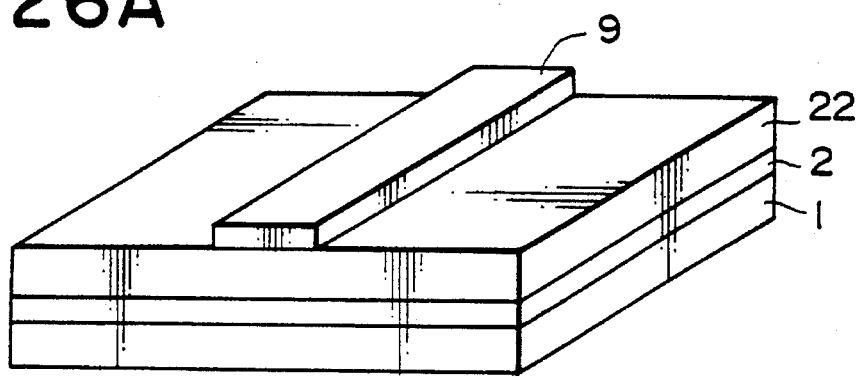
FIGS. 26A through 26C, 27A through 27C, 28A through 28D, and 29A through 29D are diagrams showing a semiconductor device and a method manufacturing the semiconductor device in accordance with a fifteenth embodiment of the present invention.
Figure 28A:
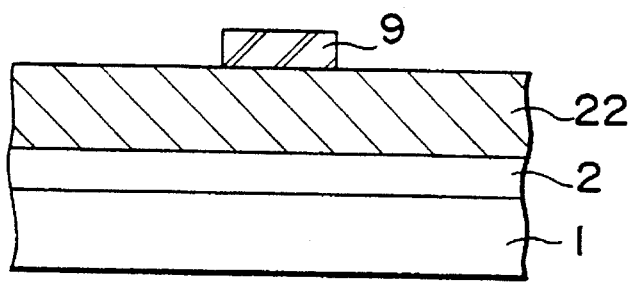

Next, silicon nitride film 9 is linearly patterned according to the channel length of the transistor to be formed (FIGS. 26A, 28A).

[Step B]

Figure 26B:
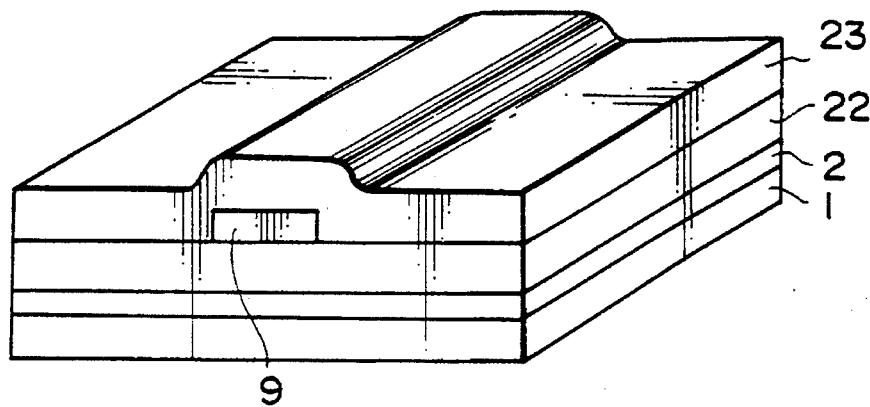
Figure 28B:
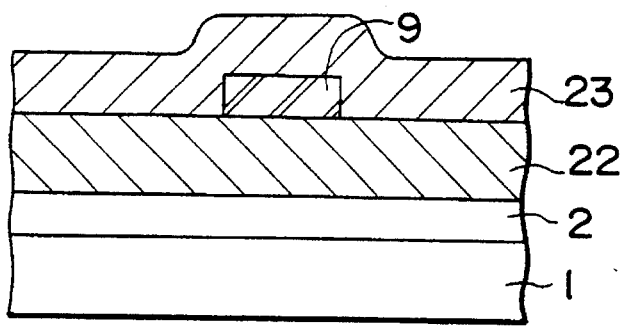

Second gate silicon film 23 to which phosphorus is added is deposited by LP-CVD to a thickness of, for example, about 1,000 Å (FIGS. 26B, 28B).

[Step C]

Figure 26C:
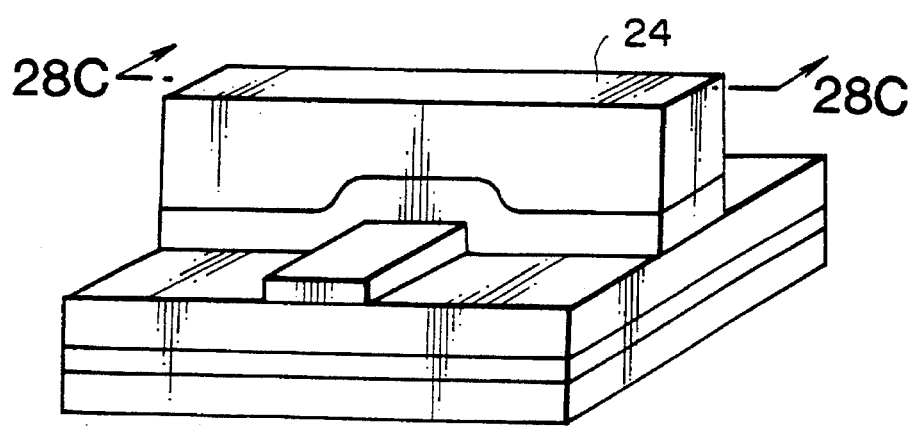
Figure 28C:
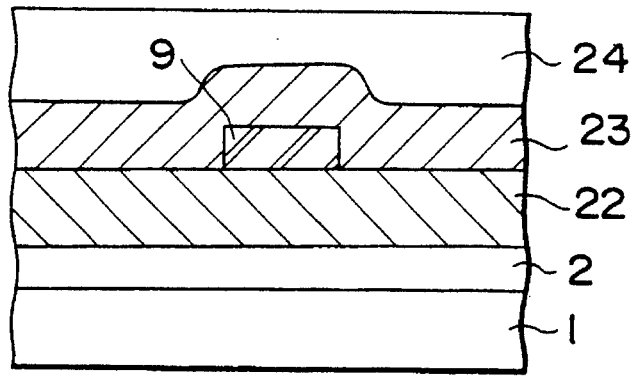

A resist is applied to the surface to form a resist film 24. Thereafter, the resist film 24 is patterned in accordance with the pattern of an active layer of the transistor to be formed. Etching is thereafter performed so that second gate silicon film 23 has the same pattern as the resist pattern (FIGS. 26C, 28C). In the step shown in FIG. 26C, only second gate silicon film 23 is etched. However, a portion of first gate silicon film 22 under second gate silicon film 23 may also be etched simultaneously.

[Step D]

Figure 27A:
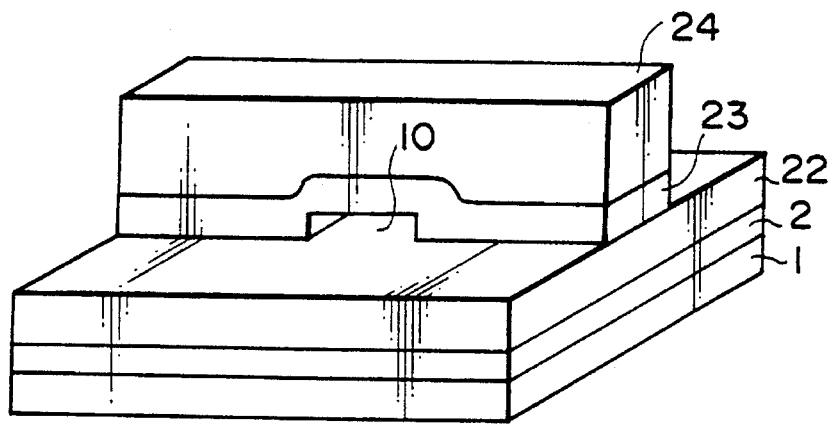
Figure 28D:
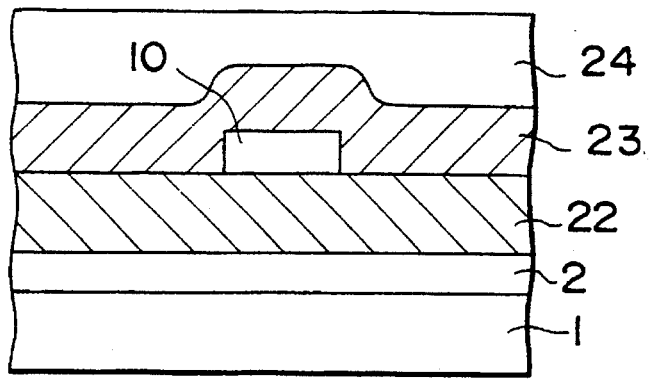

Next, silicon nitride film 9 is entirely removed by being immersed in a phosphoric acid solution at a temperature of about 150° C., while resist patterns 24 are left. Space 10 is thereby formed between first gate silicon film 22 and second gate silicon film 23 and second gate silicon film 23 has a bridge-like shape (FIGS. 27A, 28D)

[Step E]

Figure 27B:
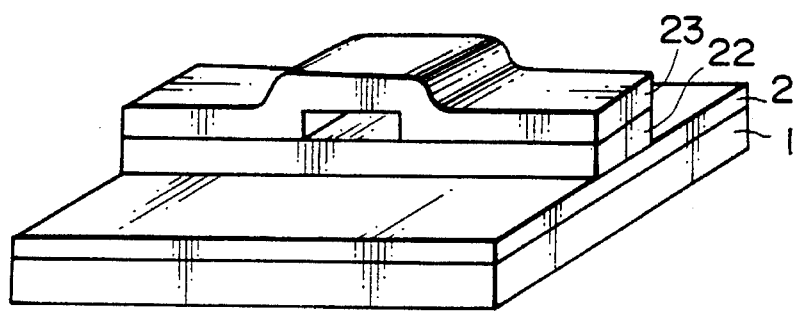
Figure 29A:
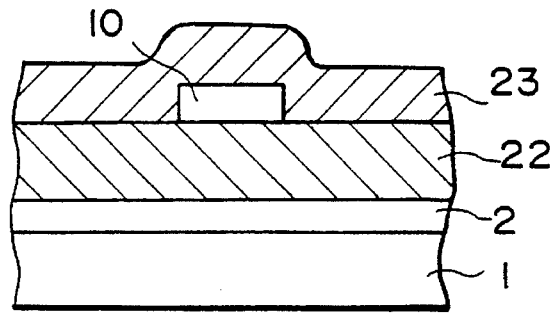

First gate silicon film 22 is patterned in accordance with the transistor to be formed by performing plasma polysilicon etching on first gate silicon film 22, with resist pattern 24 used as a mask. Thereafter, resist 24 is entirely removed by an oxygen plasma (FIGS. 27B, 29A).

[Step F]

Figure 29B:
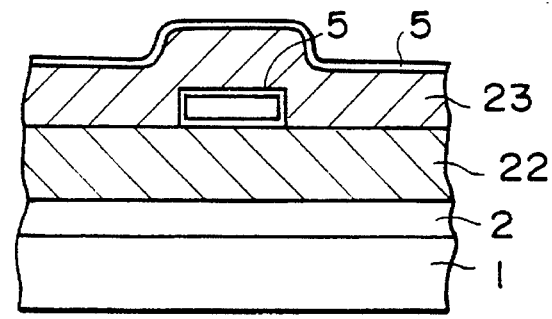

Second silicon oxide film 5 to be used as a gate insulation film is deposited by LP-CVD (400° to 900° C.) over the entire surface to a predetermined thickness (e.g., 200 Å). Second silicon oxide film 5 is thereby formed on first gate silicon film 22 and around space 10 as well as on first silicon oxide film 2 (FIG. 29B).

Figure 29C:
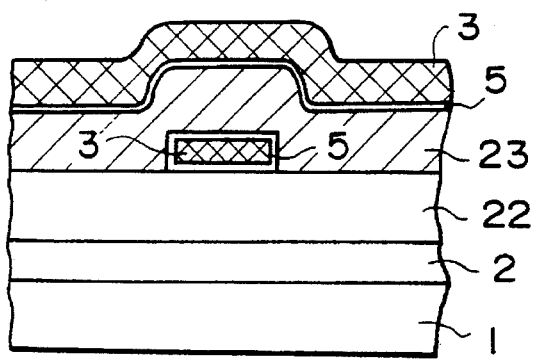

Thereafter, channel silicon film 3 is deposited over the entire surface of second silicon oxide film 5 to a predetermined thickness (e.g., 2,000 Å). At this time, space 10 under the bridge-like portion of second gate silicon film 23 is also filled with channel silicon film 3 (FIG. 29C).

Figure 27C:
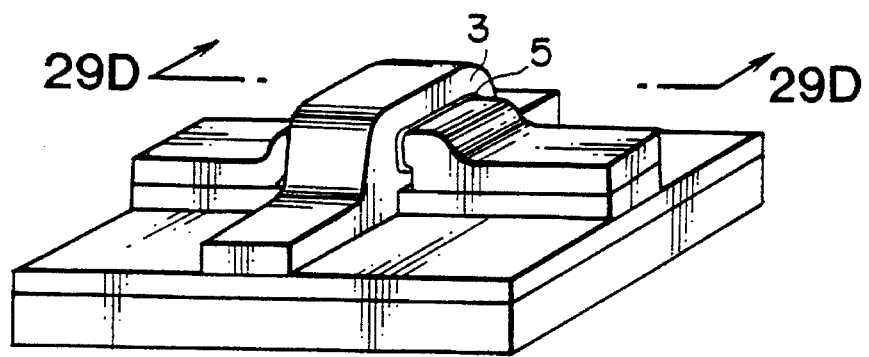
Figure 29D:
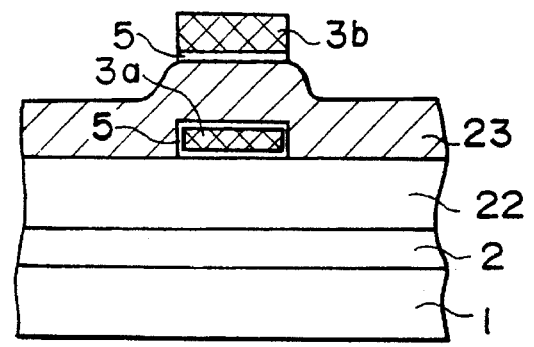

Deposited channel silicon film 3 is patterned by photolithography in accordance with a desired pattern (FIGS. 27C, 29D). In a subsequent step, arsenic ions are injected to form source and drain portions of the transistor. In the manufacturing method of this embodiment, at the time of ion implantation for forming the source and drain, a resist pattern used as a mask is first formed and arsenic ions are thereafter implanted, since gate electrodes 22 and 23 cannot be used as a mask unlike the gate electrode in Embodiment 2.

In this embodiment, silicon nitride film 9 can be replaced with a silicon oxide film formed by CVD. Silicon oxide can be removed by using high etching rate hydrofluoric acid, thereby facilitating processing.

In the transistor manufactured by the method of this embodiment, the total number of channel surfaces is three. In channel silicon film 3 sandwiched between first gate silicon film 22 and second gate silicon film 23, channels are respectively formed on the upper and lower sides. In channel silicon film 3 formed on second gate silicon film 23, one channel is formed on the gate electrode side. Thus, the transistor manufactured by the manufacturing method of this embodiment has channels formed on three surfaces and can therefore have a very large current drive capacity. According to the manufacturing method of this embodiment, a gate all around structure can be realized even by a process in which channel silicon film 3 is formed after gate silicon film 22,23.

(Embodiment 16)

The transistor in Embodiment 15 has a channel silicon film formed of two layers 3a and 3b. However, further multiple layers of channel silicon film, e.g., three, four or more layers may be formed.

Figure 30:
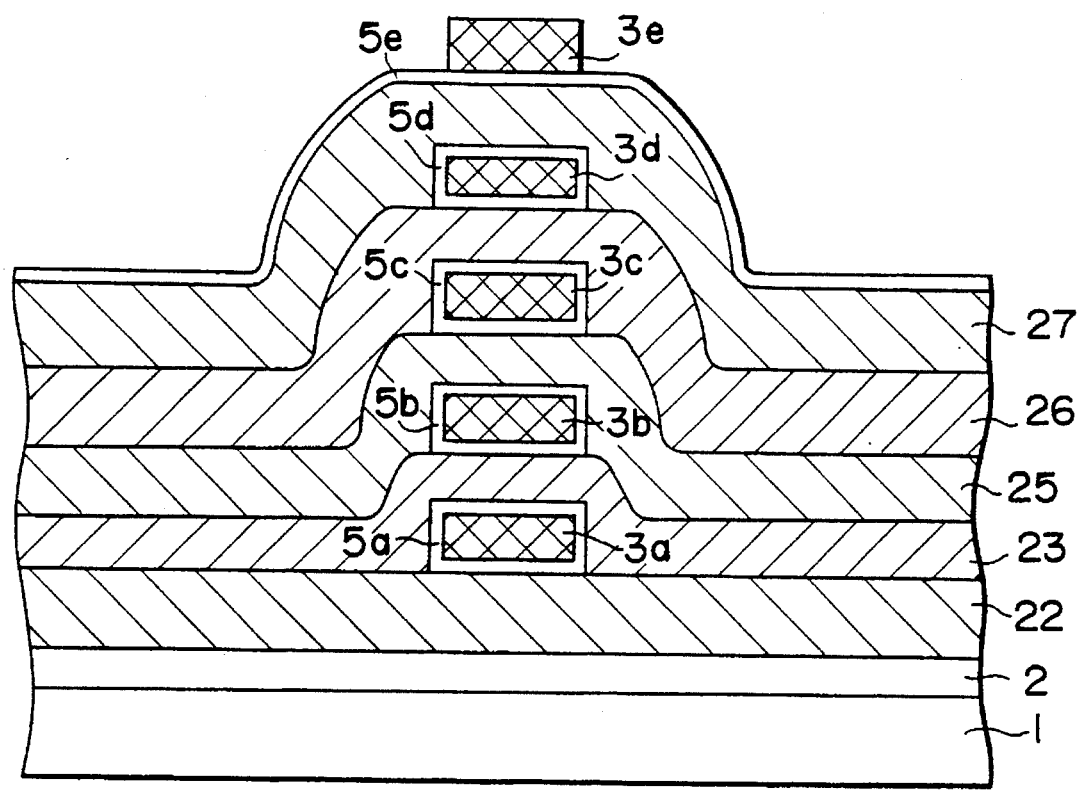
FIG. 30 is a cross-sectional view of a semiconductor device in accordance with a sixteenth embodiment of the present invention.
Figure 31A:
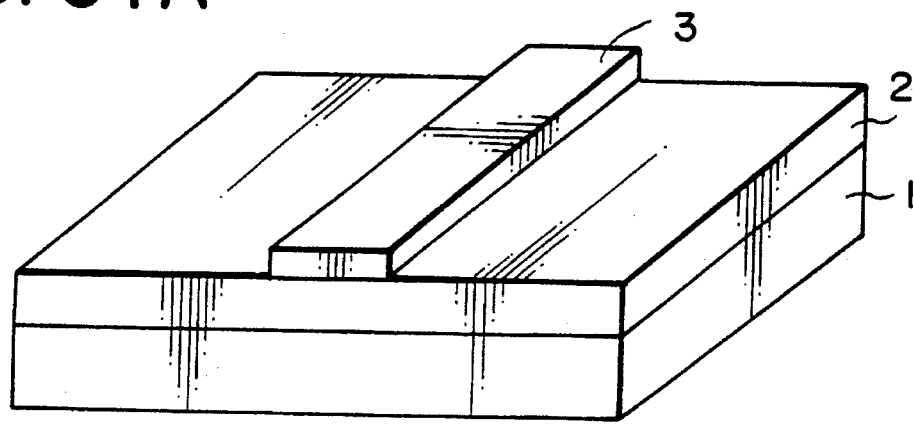
FIGS. 31A through 31C are diagrams of a conventional semiconductor device and a conventional manufacturing method.
Figure 31B:
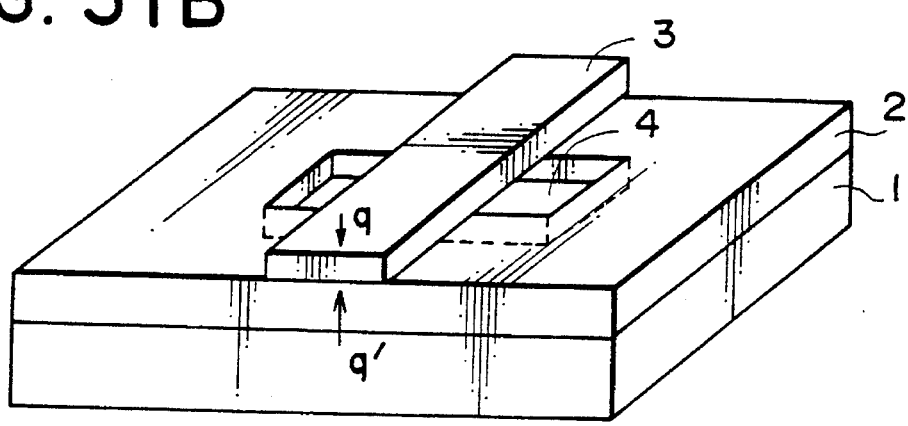
Figure 31C:
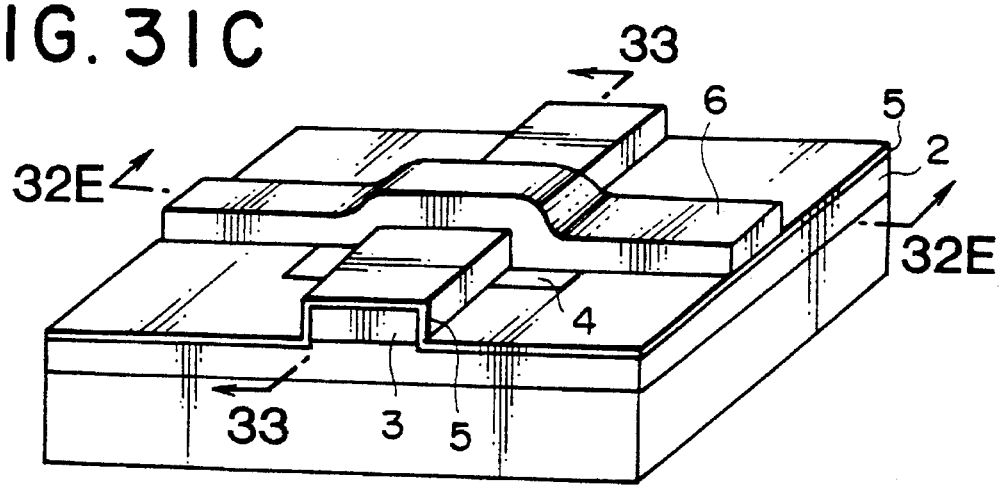
Figure 32A:
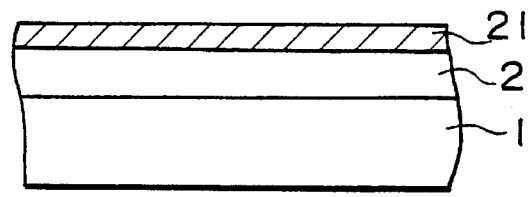
FIGS. 32A through 32E, and 33 are cross-sectional views of the conventional semiconductor device and the conventional manufacturing method.
Figure 32B:
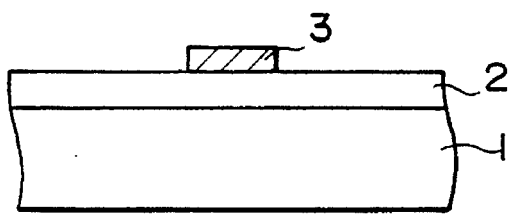
Figure 32C:
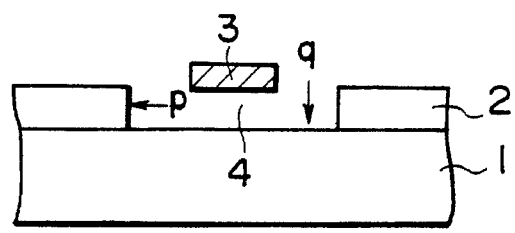
Figure 32D:
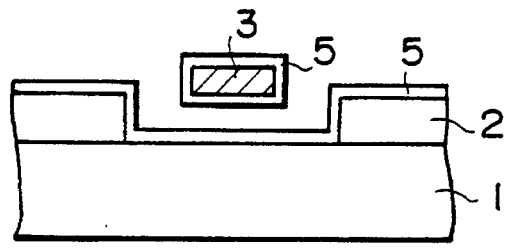
Figure 32E:
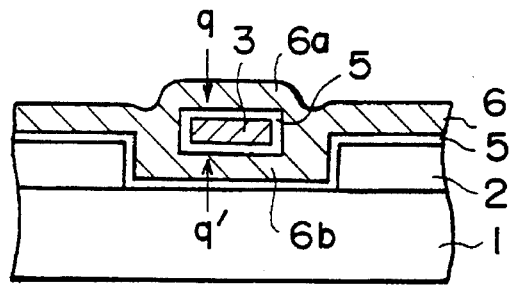
Figure 33:
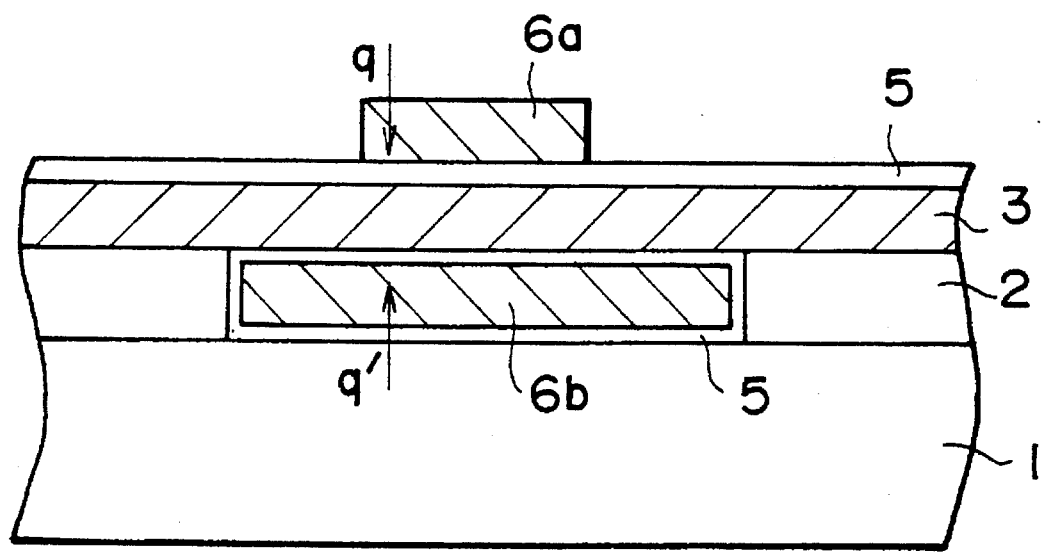

FIG. 30 shows a cross-sectional view of a transistor having five layers of channel silicon film 3. As shown in FIG. 30, first silicon oxide film 2 is formed on silicon substrate 1, and first and second gate silicon films 22 and 23 and third to fourth gate silicon films 25 to 27 are successively laid one on top of another over first silicon oxide film 2. A channel silicon film 3a is formed between first gate silicon film 22 and second gate silicon film 23; a channel silicon film 3b, between second gate silicon film 23 and third gate silicon film 25; a channel silicon film 3c, between third gate silicon film 25 and fourth gate silicon film 26; and a channel silicon film 3d, between fourth gate silicon film 26 and fifth gate silicon film 27. Further, a channel silicon film 3e is formed on fifth gate silicon film 27.

In the transistor shown in FIG. 30, channel surfaces are formed on the opposite sides of channel silicon film 3a by first gate silicon film 22 and second gate silicon film 23. Similarly, channel surfaces are formed on the opposite sides of each of channel silicon films 3b to 3d. One channel surface is formed on the lower side of the channel silicon film 3e. Accordingly, the transistor shown in FIG. 30 has nine channel surfaces and therefore has a markedly improved current drive capacity.

The method of manufacturing the transistor shown in FIG. 30 will be described. The process steps of Embodiment 15 are repeated a certain number of times to laminate multiple layers of gate silicon and silicon nitride films. Thereafter, the operation of patterning and the operation of removing silicon nitride film are repeated from the uppermost gate silicon film to obtain a structure in which multiple layers of bridge-like gate silicon film are laid one on top of another. Thereafter, gate insulating films and channel silicon are successively deposited as in the case of Embodiment 15. In this manner, a transistor in which five channel silicon films are superposed as shown in FIG. 30 can be formed.

Other structures in which a larger number of channel silicon films are superposed can be obtained in the same manner.

What is claimed is:

1. A semiconductor device comprising a transistor including:
   a substrate;
   an insulating film disposed on said substrate;
   a polycrystalline semiconductor channel member including a channel portion spaced from said insulating film and support portions at respective opposite ends of said channel portion disposed on said insulating film and supporting said channel portion; and
   a control electrode covering said channel portion on two opposite surfaces for forming a current channel in each of the two opposite surfaces of said channel portion and wherein said channel portion has a length between said supporting portions and a thickness, the length is limited relative to the thickness so that said channel portion does not droop and contact either of said insulating film and said substrate, said channel portion is spaced from said substrate by a height, and the length of said channel portion is not longer than twenty times the height.

2. The semiconductor device according to claim 1 comprising a supporting member for supporting said channel member, said supporting member being disposed between said substrate and said channel portion.

3. The semiconductor device according to claim 1 wherein said channel portion has a length not longer than forty times the thickness of said channel portion.

4. The semiconductor device according to claim 1 wherein said control electrode includes a plurality of control electrode elements respectively covering different parts of said channel portion.

5. The semiconductor device according to claim 1 wherein said channel portion includes a plurality of channel elements respectively covered by different portions of said control electrode.

6. A semiconductor device comprising a plurality of transistors including:
   a substrate;
   an insulating film on said substrate;
   a plurality of channel members disposed on said insulating film and having substantially equal widths, a channel portion of each of said channel members being spaced from said insulating film; and
   control electrodes respectively completely surrounding said channel portions, each control electrode forming a circumferential current channel in each corresponding channel portion.

7. A semiconductor device comprising a transistor including:
   a substrate;
   a planar insulating film disposed on said substrate;
   a polycrystalline semiconductor channel member partially disposed on said planar insulating film and having a channel portion extending outwardly from said planar insulating film in a bridge-like shape with a space present between said channel portion and said planar insulating film; and
   a control electrode covering said channel portion, said control electrode forming a current channel in each of two opposed surfaces of said channel portion.

8. The semiconductor device according to claim 7 comprising a spacing member located between said channel portion and said insulating film to maintain the space between said substrate and said channel portion.

9. A semiconductor device comprising a transistor including:
- a substrate;
- an insulating film on said substrate;
- a control electrode partially spaced from said insulating film;
- an oxide film of uniform thickness disposed on said control electrode; and
- a polycrystalline semiconductor channel member disposed on said oxide film surrounding at least part of said control electrode, said control electrode forming a plurality of channels in said channel member.

10. The semiconductor device according to claim 9 wherein said channel member has a thickness and said substrate and said control electrode are spaced from each other by a distance larger than the channel member thickness without a gap between said channel member and said insulating film.

11. A semiconductor device comprising a transistor including:
- a substrate;
- an insulating disposed film on said substrate;
- a first control electrode disposed on said insulating film;
- a second control electrode partially disposed on said first control electrode with a space between part of said first control electrode and said second control electrode; and
- a channel member including a first part covering said second control electrode and a second part disposed in the space between part of said first control electrode and said second control electrode, wherein said first and second control electrodes form current channels on opposite surfaces of the second part of said channel member and said second control electrode forms a current channel in the second part of said channel member opposite said second control electrode.

12. A semiconductor device comprising a transistor including a substrate, an insulating film on said substrate, and, alternatingly superposed, a plurality of control electrodes and a plurality of channel members on said insulating film wherein said control electrodes respectively form current channels in opposite surfaces of said channel members sandwiched between respective control electrodes.

* * * * *